(12) United States Patent
Chiu et al.

(10) Patent No.: US 11,734,946 B2
(45) Date of Patent: Aug. 22, 2023

(54) FINGERPRINT SENSING MODULE

(71) Applicant: Au Optronics Corporation, Hsinchu (TW)

(72) Inventors: Chao-Chien Chiu, Hsinchu (TW); Shuo-Hong Wang, Hsinchu (TW); Shih-Hua Lu, Hsinchu (TW); Hsun-Chen Chu, Hsinchu (TW); Yan-Liang Chen, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 29 days.

(21) Appl. No.: 17/338,706

(22) Filed: Jun. 4, 2021

(65) Prior Publication Data

US 2022/0050987 A1 Feb. 17, 2022

Related U.S. Application Data

(60) Provisional application No. 63/070,880, filed on Aug. 27, 2020, provisional application No. 63/066,391, filed on Aug. 17, 2020.

(30) Foreign Application Priority Data

Feb. 4, 2021 (TW) .................................. 110104319
Apr. 13, 2021 (TW) .................................. 110113292

(51) Int. Cl.
*H01L 27/32* (2006.01)
*G06V 40/13* (2022.01)
(Continued)

(52) U.S. Cl.
CPC .......... *G06V 40/1318* (2022.01); *G06F 3/042* (2013.01); *H01L 27/1462* (2013.01);
(Continued)

(58) Field of Classification Search
CPC .. G06F 3/042; H01L 27/146; H01L 27/14623
See application file for complete search history.

(56) References Cited

U.S. PATENT DOCUMENTS 8,742,527 B2 6/2014 Suzuki et al.
9,343,493 B1 5/2016 Chen et al.
(Continued)

FOREIGN PATENT DOCUMENTS

CN 102809876 12/2012
CN 109445161 3/2019
(Continued)

*Primary Examiner* — Abdul-Samad A Adediran
(74) *Attorney, Agent, or Firm* — JCIPRNET

(57) ABSTRACT

A fingerprint sensing module includes a first substrate, an active device, a photosensitive element layer, a collimation structure layer, a second substrate, a plurality of micro lenses, and a spacer pattern. The active device is disposed on the first substrate. The photosensitive element layer is disposed on the first substrate and is electrically connected to the active device. The collimation structure layer is disposed on the photosensitive element layer. The second substrate is disposed on the collimation structure layer. The micro lenses are disposed on a surface of the collimation structure layer facing away from the photosensitive element layer, and overlap the photosensitive element layer. The micro lenses are divided into a plurality of microlens groups, and the microlens groups are respectively located in a plurality of sensing pixel areas of the fingerprint sensing module. The spacer pattern extends between the microlens groups.

20 Claims, 17 Drawing Sheets

(51) Int. Cl.
*H01L 27/146* (2006.01)
*G06F 3/042* (2006.01)

(52) U.S. Cl.
CPC .. *H01L 27/14621* (2013.01); *H01L 27/14623* (2013.01); *H01L 27/14627* (2013.01); *H01L 27/14645* (2013.01); *H01L 27/14678* (2013.01)

(56) References Cited

U.S. PATENT DOCUMENTS

| | | | |
|---|---|---|---|
| 9,502,461 | B2 | 11/2016 | Cheng et al. |
| 10,665,631 | B1 | 5/2020 | Cai et al. |
| 2007/0051991 | A1 | 3/2007 | Hun |
| 2019/0026530 | A1* | 1/2019 | Wu ..................... H01L 27/146 |
| 2021/0151511 | A1* | 5/2021 | Kim ..................... G06F 3/042 |
| 2021/0210581 | A1* | 7/2021 | Ma .................... H01L 27/14623 |

FOREIGN PATENT DOCUMENTS

| | | |
|---|---|---|
| CN | 110245631 | 9/2019 |
| CN | 110720106 | 1/2020 |
| CN | 110796123 | 2/2020 |
| CN | 110928020 | 3/2020 |
| CN | 210983441 | 7/2020 |

\* cited by examiner

FINGERPRINT SENSING MODULE

CROSS-REFERENCE TO RELATED APPLICATION

This application claims the priority benefits of U.S. provisional application Ser. No. 63/066,391, filed on Aug. 17, 2020, U.S. provisional application Ser. No. 63/070,880, filed on Aug. 27, 2020, Taiwan application serial no. 110104319, filed on Feb. 4, 2021, and Taiwan application serial no. 110113292, filed on Apr. 13, 2021. The entirety of each of the above-mentioned patent applications is hereby incorporated by reference herein and made a part of this specification.

BACKGROUND

Technical Field

The disclosure relates to a sensing module, and particularly to a fingerprint sensing module.

Description of Related Art

To increase the screen-to-body ratio of the display to achieve a narrow bezel design, under-display fingerprint sensing technology has become a trend. To put it simply, the under-display fingerprint sensing technology is to dispose a fingerprint sensing module under a display panel of an electronic apparatus. After the electronic apparatus detects that a user touches the display screen, the electronic apparatus controls the display panel to emit light to illuminate the surface of the user's finger. This sensing light is then reflected (diffusely) by the user's finger and enters the fingerprint sensing module under the display panel, and the reflected light is converged on a photosensitive element through multiple microlenses and collimation structures which convert it into a digital image signal to obtain the user's fingerprint image. However, such fingerprint sensing module is prone to receive stray light incident at a large angle due to the large spacing between the microlenses, which makes the fingerprint images blurry. In addition, when the user presses the display panel to perform fingerprint recognition, the curved display panel also increases the risk of crushing the microlenses, reducing the reliability of long-term operation.

SUMMARY

The present disclosure provides a fingerprint sensing module which has better tolerance to external forces.

The present disclosure provides a fingerprint sensing module with a relatively large manufacturing process margin.

The present disclosure provides a fingerprint sensing module with better sensing sensitivity.

A fingerprint sensing module of the present disclosure includes a first substrate, an active device, a photosensitive element layer, a collimation structure layer, a second substrate, a plurality of microlenses, and a spacer pattern. The active device is disposed on the first substrate. The photosensitive element layer is disposed on the first substrate, and is electrically connected to the active device. The collimation structure layer is disposed on the photosensitive element layer. The second substrate is disposed on the collimation structure layer. The microlenses are disposed on a side surface of the collimation structure layer facing away from the photosensitive element layer, and overlap the photosensitive element layer. The microlenses are divided into a plurality of microlens groups, and the microlens groups are respectively located in sensing pixel areas of the fingerprint sensing module. The spacer pattern extends between the microlens groups.

In one embodiment of the present disclosure, the mentioned spacer pattern of the fingerprint sensing module surrounds each of the microlens groups.

In an embodiment of the present disclosure, the spacer pattern of the fingerprint sensing module as described above extends between any two adjacent ones of the microlenses.

In an embodiment of the present disclosure, the spacer pattern of the mentioned fingerprint sensing module includes a plurality of columnar portions and a plurality of extension portions. The columnar portions are respectively disposed in a plurality of sensing pixel areas. The extension portions extend between the microlenses and the columnar portions.

In an embodiment of the disclosure, the fingerprint sensing module as described above further includes a light-shielding pattern layer disposed on the second substrate. The light-shielding pattern layer has a plurality of openings, and the openings are respectively overlapped with a plurality of microlenses.

In an embodiment of the present disclosure, the fingerprint sensing module further includes a filter layer disposed between the photosensitive element layer and the collimation structure layer.

In an embodiment of the present disclosure, the fingerprint sensing module as described above further includes a light-shielding pattern layer. The light-shielding pattern layer and the spacer are disposed on the second substrate.

In an embodiment of the present disclosure, the fingerprint sensing module as described above further includes a color filter layer. The color filter layer is located between the photosensitive element layer and the light-shielding pattern layer.

In an embodiment of the present disclosure, the fingerprint sensing module of the display apparatus as described above further includes an auxiliary layer. The auxiliary layer covers a plurality of microlenses and is located between the microlenses and the spacer pattern.

A fingerprint sensing module of the present disclosure includes a first substrate, a photosensitive element layer, a collimation structure layer, a second substrate, a plurality of microlenses, and a spacer pattern. The photosensitive element layer is disposed on the first substrate. The collimation structure layer is disposed on the photosensitive element layer. The second substrate is disposed on the collimation structure layer. The microlenses are disposed between the collimation structure layer and the second substrate, and overlap the photosensitive element layer. The spacer pattern overlaps part of the microlenses.

In an embodiment of the present disclosure, the fingerprint sensing module as described above has a plurality of sensing pixel areas. The microlenses are divided into a plurality of microlens groups. The microlens groups are respectively located in the sensing pixel areas. The spacer pattern surrounds each of the microlens groups.

In an embodiment of the present disclosure, the fingerprint sensing module as described above further includes a filter layer disposed on the second substrate and located between the microlenses and the second substrate.

In an embodiment of the disclosure, a plurality of microlenses as described above are disposed on the second substrate. The spacer pattern is disposed on a side surface of the collimation structure layer facing away from the photosensitive element layer.

In an embodiment of the present disclosure, the fingerprint sensing module as described above further includes a light-shielding pattern layer, which is disposed on the second substrate and has a plurality of openings. A plurality of microlenses are disposed on a side surface of the collimation structure layer facing away from the photosensitive element layer. The spacer pattern is disposed on the second substrate and located in part of the openings of the light-shielding pattern layer.

In an embodiment of the present disclosure, the fingerprint sensing module as described above further includes a light-shielding pattern layer. The light-shielding pattern layer is disposed on the second substrate and has a plurality of openings. A plurality of microlenses are disposed on a side surface of the collimation structure layer facing away from the photosensitive element layer, and respectively overlap the openings of the light-shielding pattern layer.

A fingerprint sensing module of the present disclosure includes a first substrate, a photosensitive element layer, a collimation structure layer, a second substrate, a plurality of microlenses, light-shielding pattern layer, a flat layer, and a spacer pattern. The photosensitive element layer is disposed on the first substrate. The collimation structure layer is disposed on the photosensitive element layer. The second substrate is disposed on the collimation structure layer. The microlenses are disposed between the collimation structure layer and the second substrate, and overlap the photosensitive element layer. The light-shielding pattern layer has a plurality of first openings, and the first openings are respectively overlapped with the microlenses. The flat layer does not overlap the microlenses. The spacer pattern is adapted to overlap the flat layer. The flat layer is located between the spacer pattern and the light-shielding pattern layer.

In an embodiment of the present disclosure, the light-shielding pattern layer, the flat layer, and the spacer pattern of the fingerprint sensing module as described above are disposed on the second substrate.

In an embodiment of the present disclosure, the fingerprint sensing module as described above has a plurality of sensing pixel areas. The microlenses are divided into a plurality of microlens groups. The microlens groups are respectively located in the sensing pixel areas, and the flat layer and the spacer pattern surround each of the microlens groups.

In an embodiment of the present disclosure, the flat layer and the spacer pattern of the fingerprint sensing module as described above further extend between any two adjacent ones of the microlenses disposed in at least one direction.

In an embodiment of the present disclosure, the flat layer of the fingerprint sensing module as described above completely covers the light-shielding pattern layer, and has a plurality of second openings overlapping the first openings.

Based on the above, in the fingerprint sensing module of an embodiment of the present disclosure, by disposing the microlenses and the spacer pattern between the first substrate and the second substrate, the tolerance of external force and/or the process margin of the fingerprint sensing module may be increased, thereby improving the process yield and the reliability of the fingerprint sensing module. And, the flat layer for carrying the spacer pattern having the openings that overlap the microlenses may increase the light energy utilization rate of the fingerprint sensing module for sensing light, thereby improving the overall sensing sensitivity.

DESCRIPTION OF THE EMBODIMENTS

Figure 1A:
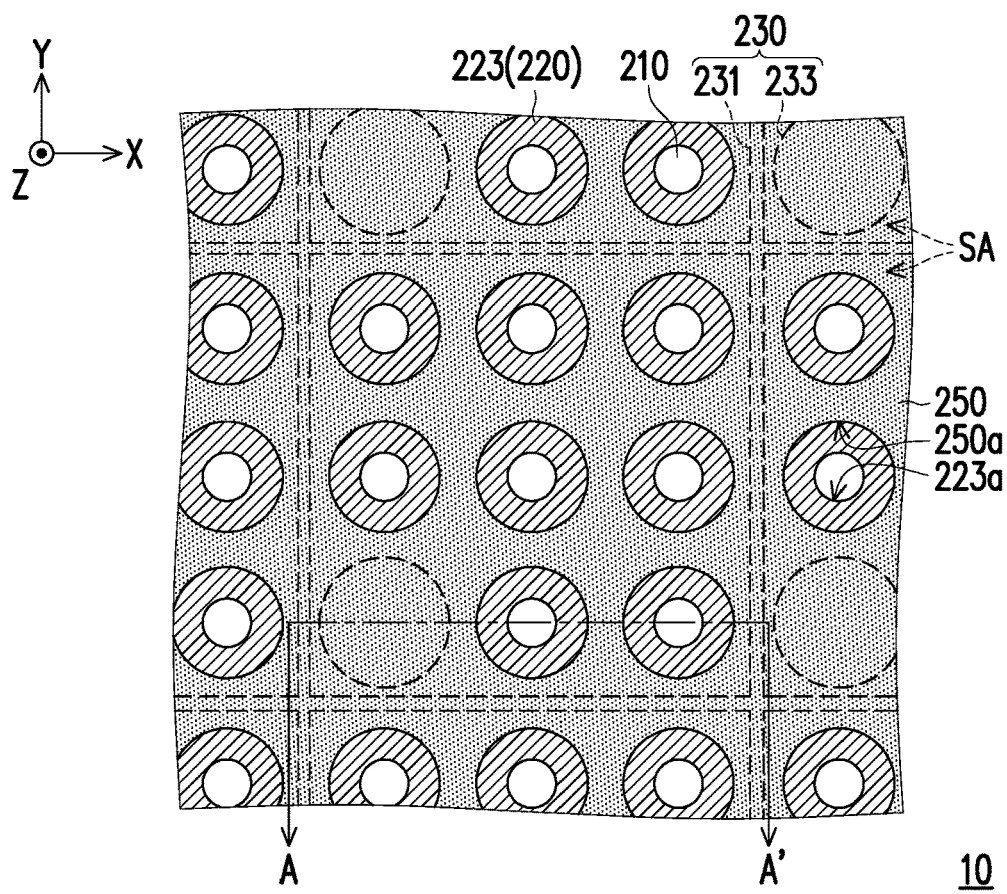
FIG. 1A is a schematic top view of a display apparatus according to a first embodiment of the disclosure.

The usages of "approximately," "similar to," "essentially" or "substantially" indicated throughout the specification include the indicated value and an average value having an acceptable deviation range, which is a certain value confirmed by people skilled in the art, and is a certain amount considered the discussed measurement and measurement-related deviation (that is, the limitation of measurement system). For example, "approximately" may indicate to be within one or more standard deviations of the indicated value, such as being within ±30%, ±20%, ±15%, ±10%, or ±5%. Furthermore, the usages of "approximately," "similar to," "essentially" or "substantially" indicated throughout the specification may refer to a more acceptable deviation scope or standard deviation depending on measurement properties, cutting properties, or other properties, and all properties may not be applied with one standard deviation.

In the drawings, for clarity, the thickness of layers, films, plates, areas, and the like are magnified. It should be understood that when an element such as a layer, a film, an area, or a substrate is indicated to be "on" another element or "connected to" another element, it may be directly on another element or connected to another element, or an element in the middle may exist. In contrast, when an element is indicated to be "directly on another element" or "directly connected to" another element, an element in the middle does not exist. For example, "to connect" indicated in the specification may indicate to physically and/or electrically connect. Furthermore, "to electrically connect" may also be used when other elements exist between two elements.

References of the exemplary embodiments of the disclosure are to be made in detail. Examples of the exemplary embodiments are illustrated in the drawings. When applicable, the same reference numerals in the drawings and the descriptions indicate the same or similar parts.

Figure 1B:
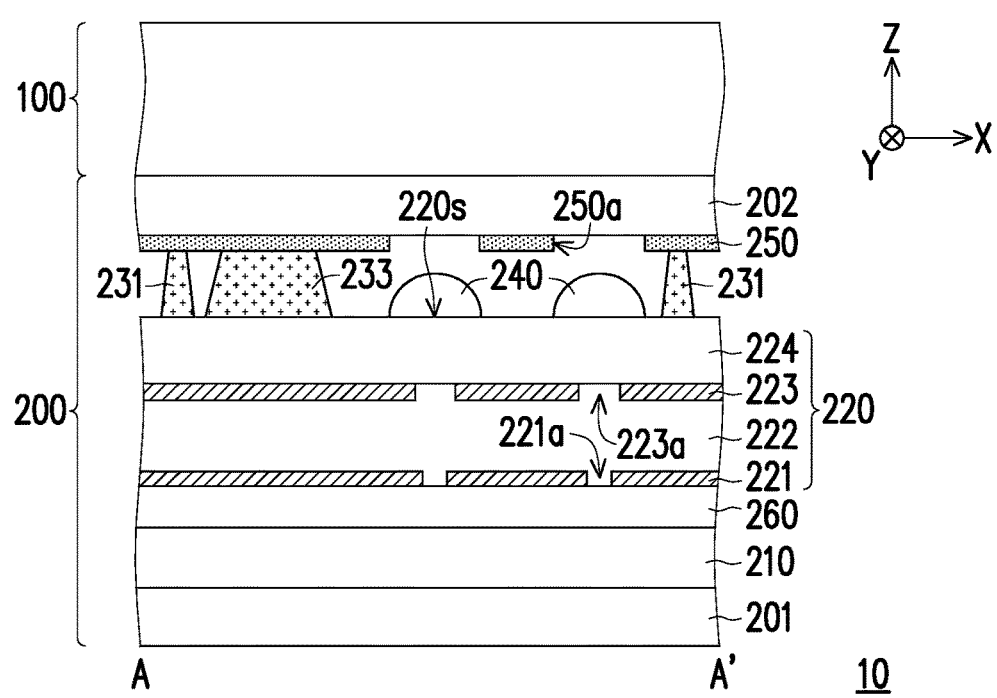
FIG. 1B is a schematic cross-sectional view of the display apparatus of FIG. 1A.

FIG. 1A is a schematic top view of a display apparatus according to a first embodiment of the disclosure. FIG. 1B is a schematic cross-sectional view of the display apparatus of FIG. 1A. FIG. 1B corresponds to a section line A-A' of FIG. 1A. For the sake of clarity, FIG. 1A only shows a photosensitive element layer 210, a light-shielding pattern layer 223 of a collimation structure layer 220, a spacer pattern 230, and a light-shielding pattern layer 250 of FIG. 1B.

In FIG. 1A and FIG. 1B, a display apparatus 10 includes a display panel 100 and a fingerprint sensing module 200. The fingerprint sensing module 200 is adapted to overlap the display panel 100 and has a plurality of sensing pixel areas SA. The sensing pixel areas SA may be disposed in an array. For example, the sensing pixel areas SA may be disposed in multiple columns and multiple rows that are respectively in a direction X and a direction Y. In this embodiment, the fingerprint sensing module 200 may be disposed on the back side of the display panel 100. To put it more specifically, the display apparatus 10 may be an under-display fingerprint on a display apparatus.

The display panel 100 is, for example, an organic light-emitting-diode (OLED) panel, a micro light-emitting-diode (micro-LED) panel, a sub-millimeter light-emitting-diode (mini-LED) panel, or other suitable self-luminous display panel. It needs to be clarified that in this embodiment, the display panel 100 may be adapted as an illuminating light source for fingerprint recognition at the same time. However, the present disclosure is not limited thereto. In other embodiments, the display panel may also be a non-self-luminous display panel (for example, a liquid crystal display panel), and the display apparatus uses a backlight source to provide illuminating light required for fingerprint recognition.

The fingerprint sensing module 200 includes a first substrate 201, a second substrate 202, a photosensitive element layer 210, a collimation structure layer 220, a spacer pattern 230, and a plurality of microlenses 240. The photosensitive element layer 210 is disposed on the first substrate 201. The collimation structure layer 220 is disposed on the photosensitive element layer 210. The second substrate 202 is disposed between the photosensitive element layer 210 and the display panel 100. For example, the photosensitive element layer 210 may include a plurality of photosensitive elements (not illustrated) and a plurality of control elements (not illustrated), and the electrical connection relationship between the control elements and the photosensitive elements may be one-to-one or one-to-many. The control element here is, for example, a thin film transistor (TFT), and these control elements are suitable for sequentially transmitting the electrical signals from these photosensitive elements to a signal-processing circuit (not illustrated) via multiple signal lines (not illustrated) to perform fingerprint image recognition, but the disclosure is not limited thereto.

In this embodiment, the microlenses 240 may be selectively disposed on a side surface 220s of the collimation structure layer 220 facing away from the photosensitive element layer 210, but it is not limited thereto. The microlenses 240 may be divided into a plurality of microlens groups, and the microlens groups are respectively located in the sensing pixel areas SA. For example, the number of the microlenses 240 provided in each of the sensing pixel areas SA is eight, and these eight microlenses 240 constitute the aforementioned microlens group, but it is not limited thereto. In other embodiments, the number of the microlenses 240 disposed in each of the sensing pixel areas SA (or the microlens groups) may be adjusted according to the actual product design. For example, there is only one microlens 240 and one sensing element disposed in each of the sensing pixel areas SA, and their correspondence relationship is one-to-one.

Furthermore, the collimation structure layer 220 includes at least one light-shielding pattern layer. For example, in this embodiment, the collimation structure layer 220 may optionally include two light-shielding pattern layers, which are respectively a first light-shielding pattern layer 221 and a second light-shielding pattern layer 223. These light-shielding pattern layers are all disposed between the microlenses 240 and the photosensitive element layer 210, and the second light-shielding pattern layer 223 is disposed between the microlenses 240 and the first light-shielding pattern layer 221. The first light-shielding pattern layer 221 has a plurality of first openings 221a, and the first openings 221a respectively overlap the microlenses 240 in the stacking direction (for example, a direction Z) of the two light-shielding pattern layers. The second light-shielding pattern layer 223 has a plurality of second openings 223a, and the second openings 223a respectively overlap the first openings 221a (or the microlenses 240) in the direction Z.

In this embodiment, each of the microlenses 240 corresponds to one of the corresponding first openings 221a, one of the corresponding second openings 223a, and one of the corresponding photosensitive elements of the photosensitive element layer 210. However, the present disclosure is not limited thereto. According to other embodiments, each microlens 240 may also correspond to at least two photosensitive elements of the photosensitive element layer 210. To achieve the effect of light collimation, a flat layer 222 is provided between the first light-shielding pattern layer 221 and the second light-shielding pattern layer 223, and a flat layer 224 may be optionally provided between the second light-shielding pattern layer 223 and the microlenses 240, but it is not limited thereto. It is worth mentioning that the arrangement of the flat layer 224 may also increase the adhesion between the microlens 240 and the collimation structure layer 220.

In this embodiment, the spacer pattern 230 may be selectively disposed on the surface 220s of the collimation structure layer 220 without overlapping the microlenses 240. For example, the spacer pattern 230 includes a plurality of extension portions 231 and a plurality of columnar portions 233. The extension portions 231 extend between the sensing pixel areas SA. From another point of view, the extension portions 231 define the sensing pixel areas SA of the fingerprint sensing module 200, and the multiple microlens groups mentioned earlier are surrounded by the extension portions 231. From yet another point of view, the columnar portions 233 are respectively provided in these sensing pixel areas SA. In this embodiment, the number of the columnar portions 233 provided in each of the sensing pixel areas SA is exemplified to be one, and it does not mean that the present disclosure is limited by the content of the drawings. In other embodiments not shown, the number of the columnar portions 233 provided in each of the sensing pixel areas SA may be adjusted to two or more based on the requirements of the actual product.

Note that the present disclosure is not limited to the contours of vertical projections of the extension portions 231 and the columnar portions 233 on the photosensitive element layer 210. For example, in other embodiments, the vertical projection contour of the columnar portion on the photosensitive element layer 210 may also be rectangular, elliptical, polygonal, or any other shape that is suitable for being disposed between the microlenses 240, whereas the vertical projection contour of the extension portion on the photosensitive element layer 210 may also have an arc shape, a wave shape, a folding line shape, or any other suitable shape of line. In addition, in some embodiments, the columnar portion and the extension portion of the spacer pattern may also be selectively connected, but it is not limited thereto.

By disposing the second substrate 202 between the display panel 100 and the microlenses 240 and disposing the spacer pattern 230 between the second substrate 202 and the collimation structure layer 220, the curved display panel 100 is prevented from crushing and damaging the microlenses 240 when the user performs fingerprint recognition. In other words, the external force tolerance of the fingerprint sensing module 200 may be increased, thereby improving the reliability of the display apparatus 10. In addition, if the display apparatus needs to be slimmer and lighter, the above configuration may also prevent the microlenses 240 from being squeezed and damaged during the thinning process of the substrate, thereby increasing the process margin, which helps improve the overall process yield.

The fingerprint sensing module 200 may also optionally include another light-shielding pattern layer 250 disposed on the second substrate 202. The light-shielding pattern layer 250 has a plurality of openings 250a, and the openings 250a respectively overlap the microlenses 240 in the light-receiving direction (for example, the direction Z) of the fingerprint sensing module 200. On the other hand, the fingerprint sensing module 200 may also optionally include a filter layer 260, and the filter layer 260 may be selectively disposed between the collimation structure layer 220 and the photosensitive element layer 210. In this embodiment, in order to reduce the interference from unexpected light, the filter layer 260 may be an infrared cut-off filter, and the material of the infrared cut-off filter layer may include a cyan resist material. For example, the infrared cut-off filter made of cyan resist material has a transmittance of more than 80% for light with a wavelength between 495 nm and 570 nm, and the transmittance of light with wavelengths between 400 nm and 450 nm and between 625 nm and 700 nm may be less than 10%, but it is not limited thereto.

However, the present disclosure is not limited thereto. In other embodiments, in order for the fingerprint sensing module 200 to have an anti-counterfeiting function, the filter layer 260 may also be a color filter layer with multiple color resist patterns.

Other embodiments are described below to explain the disclosure in detail, and the same elements will be denoted by the same reference numerals, and the description of the same technical content will be omitted. For the description of the omitted part, reference may be made to the above embodiment, and details are not described in the following embodiments.

Figure 2A:
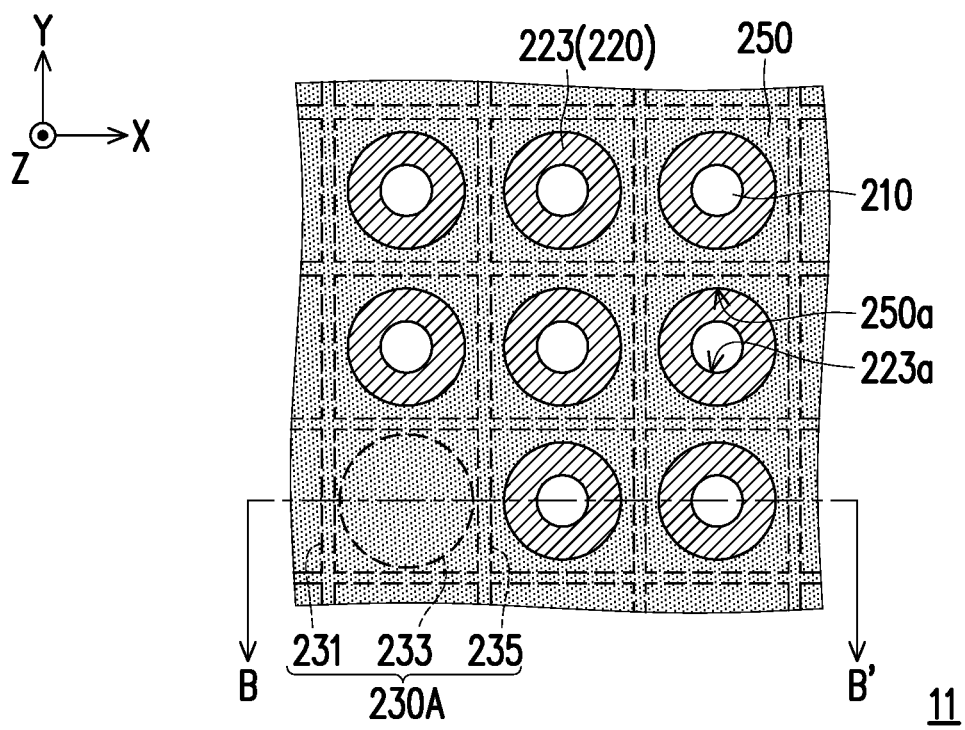
FIG. 2A is a schematic top view of a display apparatus according to a second embodiment of the disclosure.
Figure 2B:
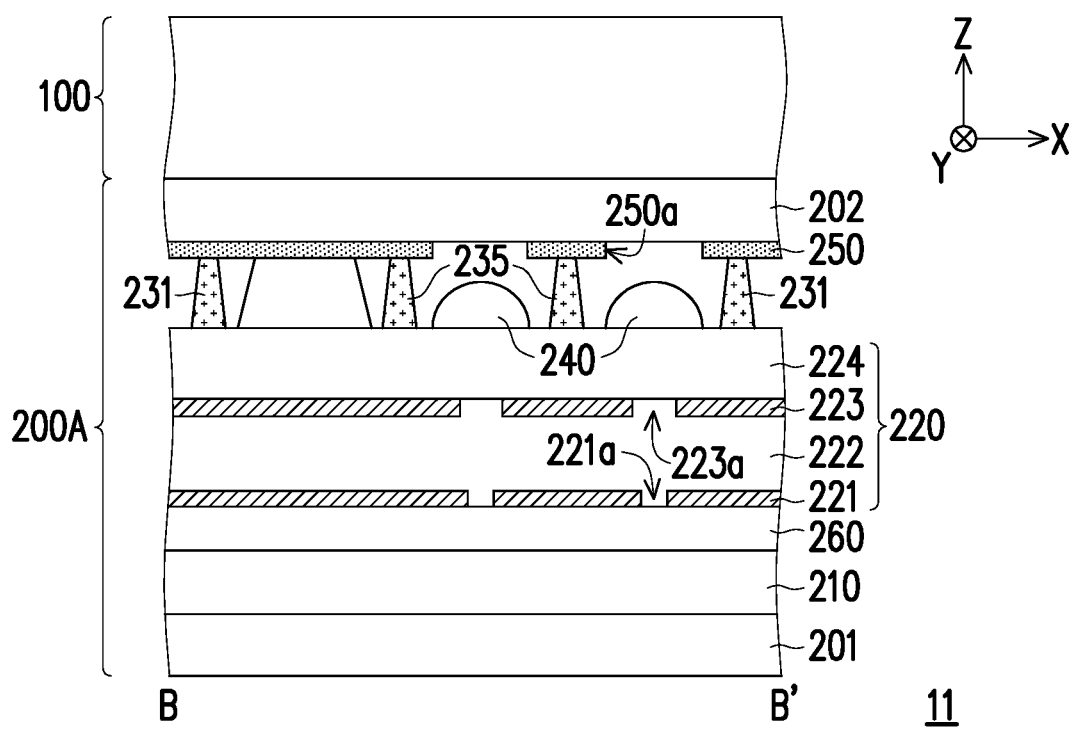
FIG. 2B is a schematic cross-sectional view of the display apparatus of FIG. 2A.

FIG. 2A is a schematic top view of a display apparatus according to a second embodiment of the disclosure. FIG. 2B is a schematic cross-sectional view of the display apparatus of FIG. 2A. FIG. 2B corresponds to a section line B-B' of FIG. 2A. For the sake of clarity, FIG. 2A only shows a photosensitive element layer 210, a light-shielding pattern layer 223 of a collimation structure layer 220, a spacer pattern 230A, and a light-shielding pattern layer 250 of FIG. 2B.

In FIG. 2A and FIG. 2B, the difference between the display apparatus 11 of this embodiment and the display apparatus 10 of FIG. 1A lies in the arrangement of the spacer pattern. Specifically speaking, the spacer pattern 230A of the display apparatus 11 further extends between any adjacent two of a plurality of microlenses 240 in each of the sensing pixel areas SA. For example, in this embodiment, the spacer pattern 230A further includes a plurality of extension portions 235 extending between the microlenses 240 and a plurality of columnar portions 233. The extension portions 235 further divide each of the sensing pixel areas SA into a plurality of sub-areas, and each sub-area is provided with one of the microlens 240. With the arrangement of these extensions portions 235, the tolerance of external force and the process margin of a fingerprint sensing module 200A may be further increased.

On the other hand, in this embodiment, the material of the spacer pattern 230A may include a light-absorbing material (for example, a black resin material), but it is not limited thereto. Therefore, the arrangement of the spacer pattern 230A may also prevent the microlenses 240 from receiving stray light incident at a large angle, such that the collimation effect may be improved, thereby improving the fingerprint recognition capability of the fingerprint sensing module 200A (that is, the resolution of fingerprint images).

Figure 3A:
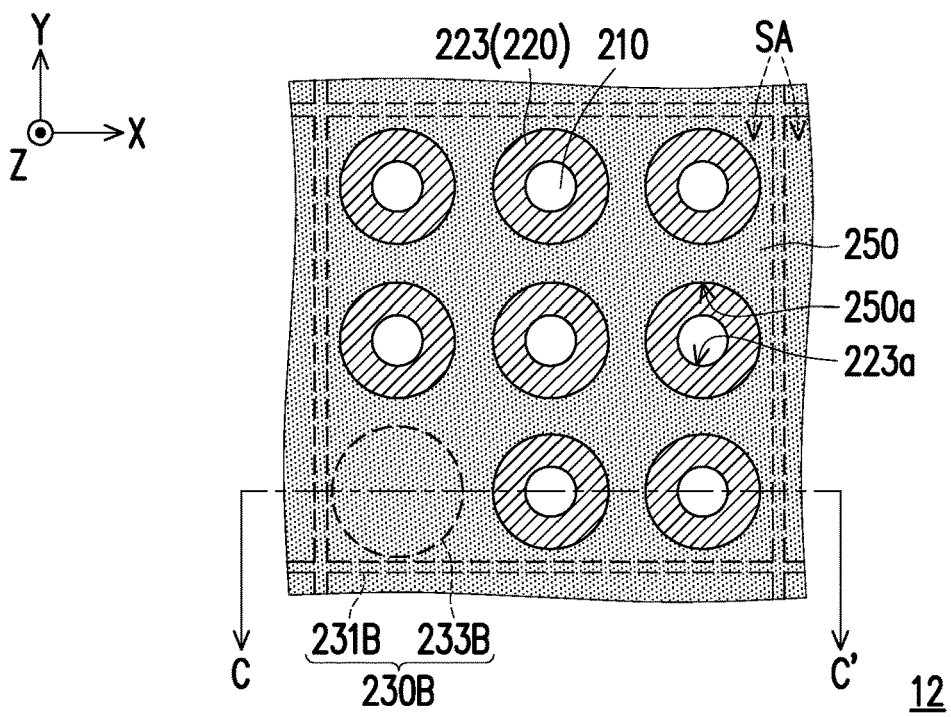
FIG. 3A is a schematic top view of a display apparatus according to a third embodiment of the disclosure.
Figure 3B:
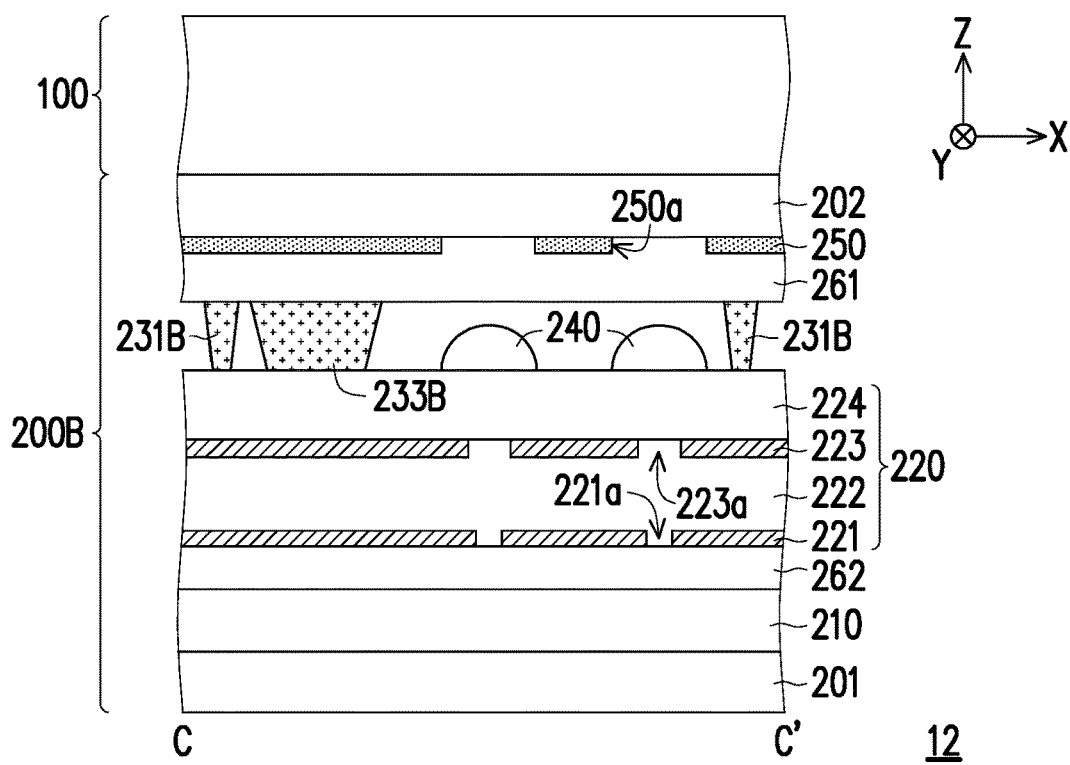
FIG. 3B is a schematic cross-sectional view of the display apparatus of FIG. 3A.
Figure 4:
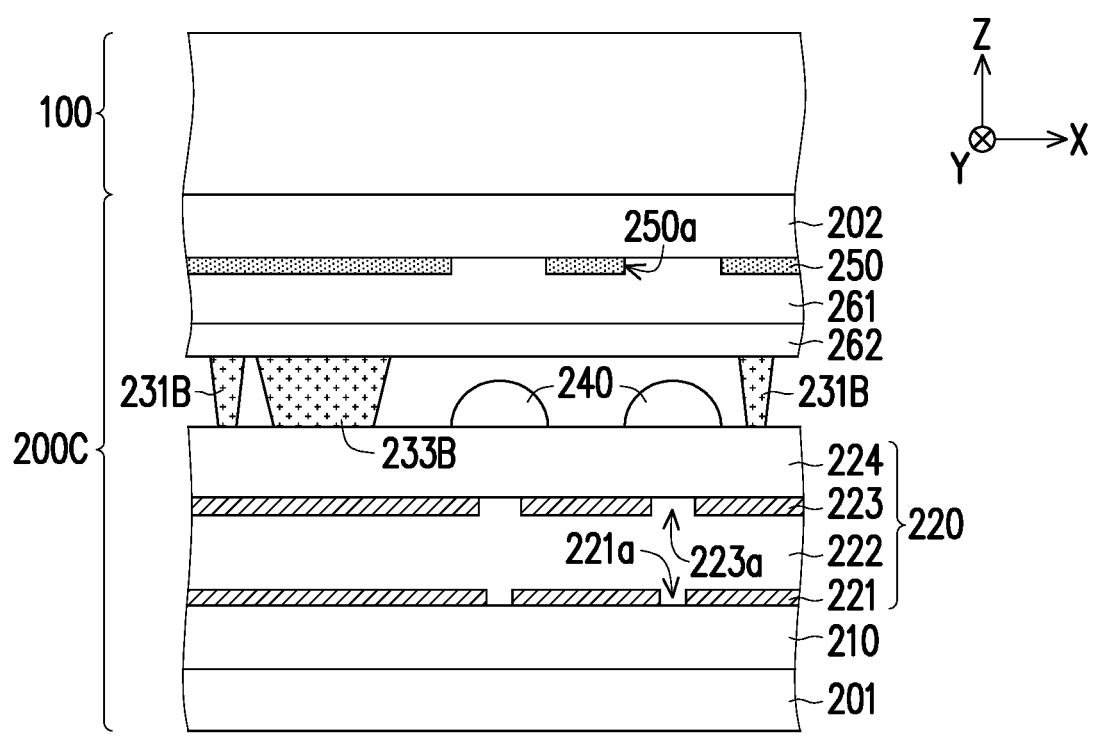
FIG. 4 is a schematic cross-sectional view of a display apparatus according to a fourth embodiment of the disclosure.

FIG. 3A is a schematic top view of a display apparatus according to a third embodiment of the disclosure. FIG. 3B is a schematic cross-sectional view of the display apparatus of FIG. 3A. FIG. 3B corresponds to a section line C-C' of FIG. 3A. FIG. 4 is a schematic cross-sectional view of a display apparatus according to a fourth embodiment of the disclosure. For the sake of clarity, FIG. 3A only shows a photosensitive element layer 210, a light-shielding pattern layer 223 of a collimation structure layer 220, a spacer pattern 230B, and a light-shielding pattern layer 250 of FIG. 3B.

In FIG. 3A and FIG. 3B, the main difference between the display apparatus 12 of this embodiment and the display apparatus 10 of FIG. 1A lies in the number of the filter layer. In this embodiment, the display apparatus 12 has two filter layers, namely an infrared cut-off filter layer 261 and a color filter layer 262, and the two filter layers overlap each other in a direction Z. The infrared cut-off filter layer 261 is disposed on a second substrate 202 and covers the light-shielding pattern layer 250. However, the present disclosure is not limited thereto. In other embodiments, the infrared cut-off filter layer 261 may also be disposed between the light-shielding pattern layer 250 and the second substrate 202.

The color filter layer 262 is disposed on a first substrate 201 and is located between the photosensitive element layer 210 and the collimation structure layer 220. However, the present disclosure is not limited thereto. In other embodiments, the color filter layer 262 of the fingerprint sensing module 200C may also be disposed on the second substrate 202, and the infrared cut-off filter layer 261 may be located between the second substrate 202 and the color filter layer 262 (as shown in FIG. 4).

On the other hand, different from the foregoing embodiment, the spacer pattern 230B of this embodiment is disposed on the second substrate 202, and the infrared cut-off filter layer 261 is located between the spacer pattern 230B and the second substrate 202. In addition, since the configuration of the extension portion 231B and the columnar portion 233B of the spacer pattern 230B and the technical effects to be achieved are similar to those of the spacer pattern 230 in FIG. 1A, please refer to the relevant paragraphs of the foregoing embodiment for the descriptions in detail, as they are not repeated herein.

In this embodiment, the material of the infrared cut-off filter layer 261 may include cyan resist material. Therefore, the infrared cut-off filter layer 261 may have the effect of a flat layer, which is beneficial to the formation of the spacer pattern 230B.

Figure 5A:
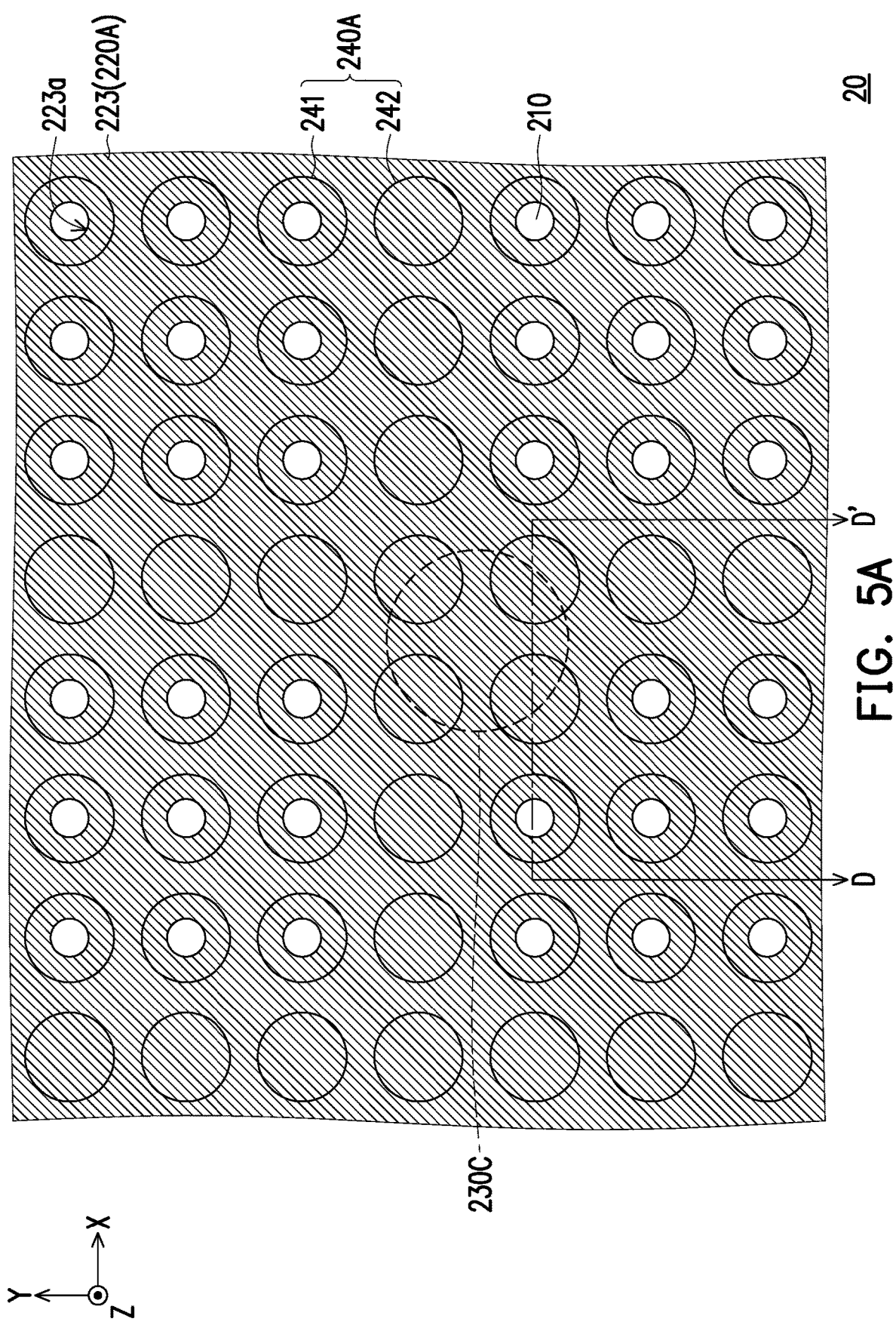
FIG. 5A is a schematic top view of a display apparatus according to a fifth embodiment of the present disclosure.
Figure 5B:
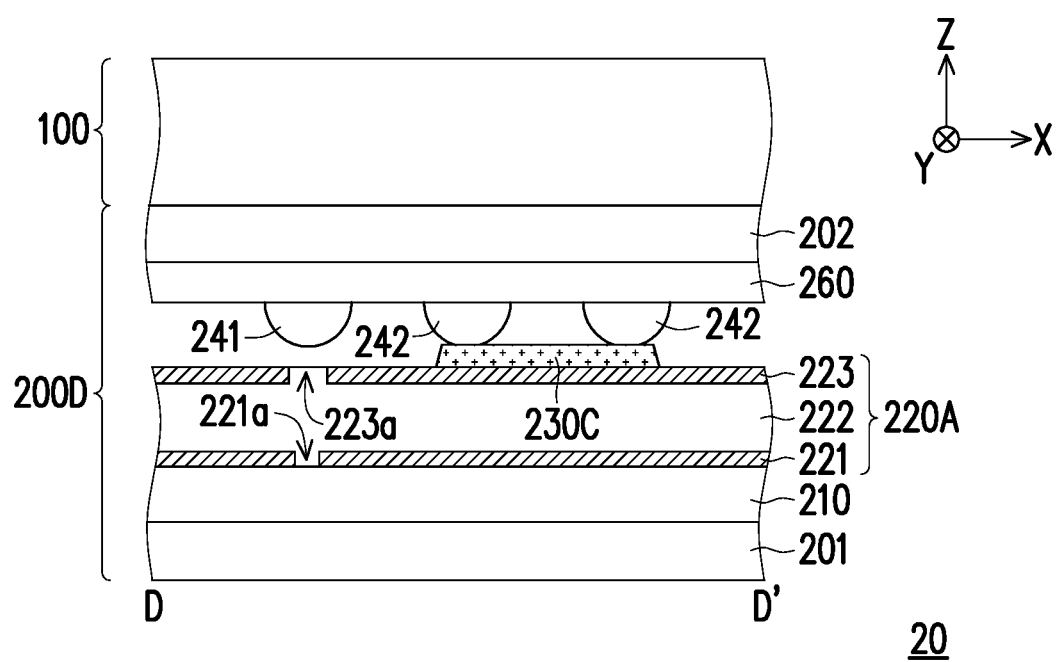
FIG. 5B is a schematic cross-sectional view of the display apparatus of FIG. 5A.

FIG. 5A is a schematic top view of a display apparatus according to a fifth embodiment of the present disclosure. FIG. 5B is a schematic cross-sectional view of the display apparatus of FIG. 5A. FIG. 5B corresponds to a section line D-D' of FIG. 5A. For the sake of clarity, FIG. 5A only shows a photosensitive element layer 210, a light-shielding pattern layer 223 of a collimation structure layer 220A, a spacer pattern 230C, and a plurality of microlenses 240A of FIG. 5B.

In FIG. 5A and FIG. 5B, the main difference between a display apparatus 20 of this embodiment and the display apparatus 10 of FIG. 1A lies in the arrangement of the spacer pattern. Specifically, the spacer pattern 230C of a fingerprint sensing module 200D of the display apparatus 20 may selectively overlap part of the microlens 240A in a direction Z.

For example, in this embodiment, the microlenses 240A may be divided into a plurality of first microlenses 241 and a plurality of second microlenses 242, and the first microlenses 241 are adapted to condense the light from the light-receiving surface (such as the interface between a display panel 100 and the fingerprint sensing module 200D) of the fingerprint sensing module 200D on the photosensitive elements (not illustrated) of the photosensitive element layer 210, and the second microlenses 242 are not adapted for light guiding. In other words, the second microlens 242 are dummy microlens. Therefore, the part where a light-shielding pattern layer 221 and the light-shielding pattern layer 223 of the collimation structure layer 220A overlap these second microlenses 242 is not provided with openings.

Please particularly note that the spacer pattern 230C (for example, the columnar portion) of this embodiment overlaps at least part of the second microlenses 242 in the direction Z, and part of the second microlens 242 directly abut against the spacer pattern 230C. Accordingly, the design margin of the spacer pattern 230C may be increased. For example, in this embodiment, the material of the spacer pattern 230C has elasticity to prevent the second microlens 242 and the spacer pattern 230C from being damaged by the squeeze of an external force, thereby ensuring that the supporting effect generated by the abutting relationship between the second microlens 242 and the spacer pattern 230C is unlikely to be degraded under long-term operation. However, the present disclosure is not limited thereto. In other embodiments, the material of the spacer pattern 230C may also have a specific stiffness.

In this embodiment, a columnar portion of the spacer pattern 230C overlaps the second microlenses 242. For example, the number of the second microlenses 242 overlapping a columnar portion of the spacer pattern 230C is four, but the present disclosure is not limited thereto. In other embodiments, the number of the second microlenses 242 overlapping each columnar portion may be adjusted based on the actual product design (for example, the size of the tolerance of external force or the selection of materials).

On the other hand, in this embodiment, the microlens 240A and a filter layer 260 are disposed on a second substrate 202, and the filter layer 260 is located between the microlenses 240A and the second substrate 202. Therefore, there is enough space between the first microlenses 241 and the collimation structure layer 220A, so that it is not necessary for the collimation structure layer 220A to have the flat layer 224 of FIG. 1B, but it is not limited thereto.

Figure 6A:
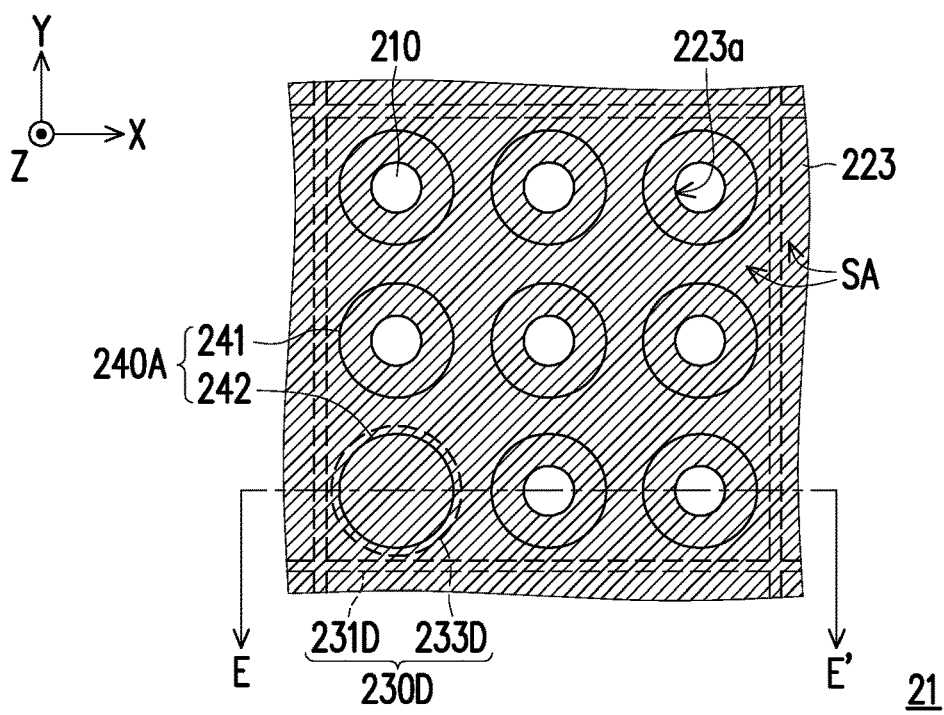
FIG. 6A is a schematic top view of a display apparatus according to a sixth embodiment of the disclosure.
Figure 6B:
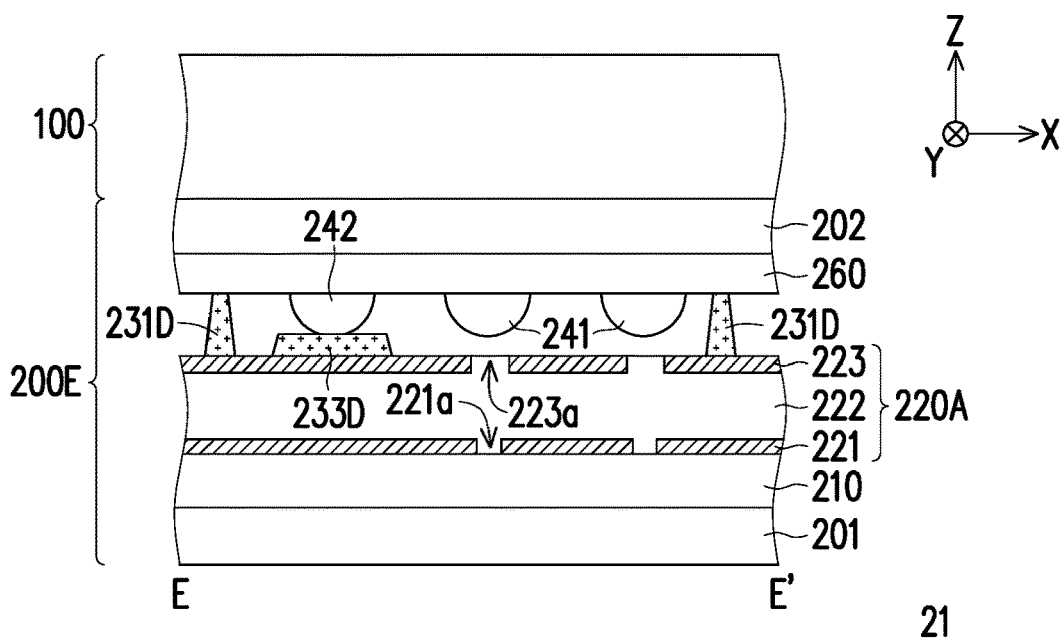
FIG. 6B is a schematic cross-sectional view of the display apparatus of FIG. 6A.

FIG. 6A is a schematic top view of a display apparatus according to a sixth embodiment of the disclosure. FIG. 6B is a schematic cross-sectional view of the display apparatus of FIG. 6A. FIG. 6B corresponds to a section line E-E' of FIG. 6A. For the sake of clarity, FIG. 6A only shows a photosensitive element layer 210, a light-shielding pattern layer 223 of a collimation structure layer 220A, a spacer pattern 230D, and a plurality of microlenses 240A of FIG. 6B.

In FIG. 6A and FIG. 6B, the main difference between a display apparatus 21 of this embodiment and the display apparatus 20 of FIG. 5A lies in the composition and the arrangement of the spacer pattern. Specifically speaking, the number of second microlenses 242 overlapping in a direction Z of a columnar portion 233D of the spacer pattern 230D of the display apparatus 21 is one. In order to improve the supporting effect, the spacer pattern 230D further has a plurality of extension portions 231D defining a plurality of sensing pixel areas SA, and the aforementioned microlenses groups are respectively located in the sensing pixel areas SA. In other words, the extension portions 231D surround each of the microlens groups.

Since the extension portion 231D of the spacer pattern 230D of this embodiment is similar to the extension portion 231 of the spacer pattern 230 of FIG. 1A, please refer to the relevant paragraphs of the foregoing embodiment for detailed descriptions, as they are not repeated herein.

Figure 7A:
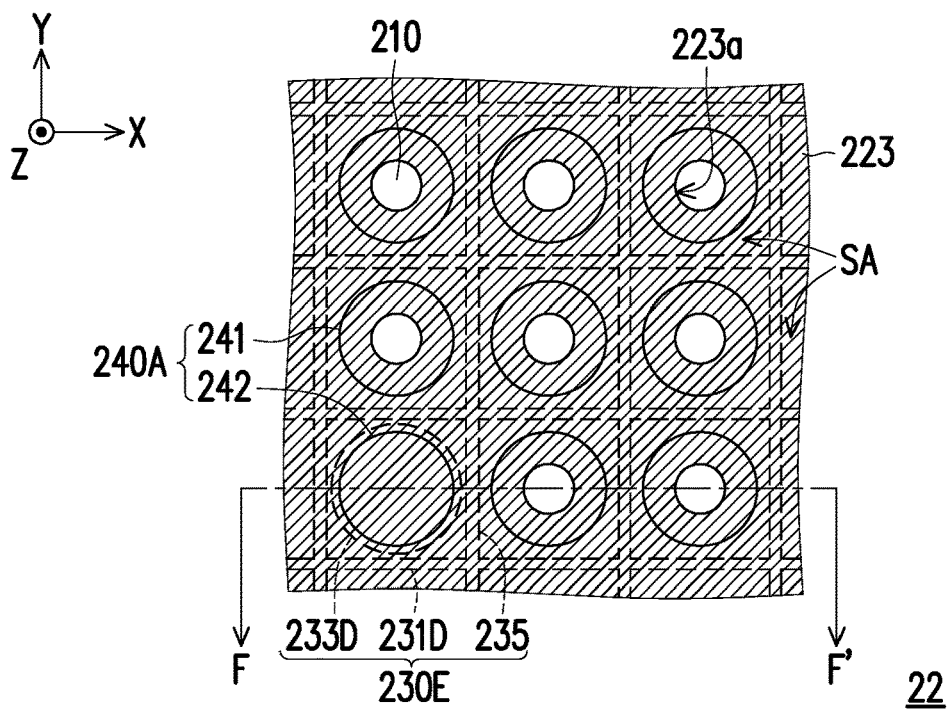
FIG. 7A is a schematic top view of a display apparatus according to a seventh embodiment of the disclosure.
Figure 7B:
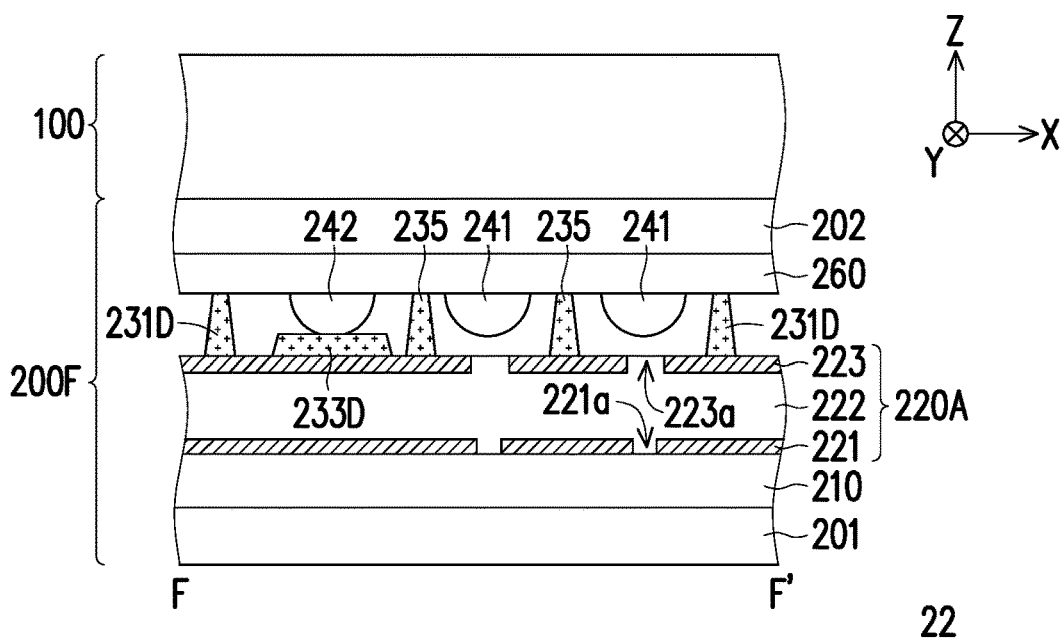
FIG. 7B is a schematic cross-sectional view of the display apparatus of FIG. 7A.

FIG. 7A is a schematic top view of a display apparatus according to a seventh embodiment of the disclosure. FIG. 7B is a schematic cross-sectional view of the display apparatus of FIG. 7A. FIG. 7B corresponds to a section line F-F' of FIG. 7A. For the sake of clarity, FIG. 7A only shows a photosensitive element layer 210, a light-shielding pattern layer 223 of a collimation structure layer 220A, a spacer pattern 230E, and a plurality of microlenses 240A of FIG. 7B.

In FIG. 7A and FIG. 7B, the difference between a display apparatus 22 of this embodiment and the display apparatus 21 of FIG. 6A lies in the composition of the spacer pattern. Specifically speaking, the spacer pattern 230E of the display apparatus 22 further includes a plurality of extension portions 235 extending between the microlenses 240A and a plurality of columnar portions 233D. The extension portions 235 further divide each of the sensing pixel areas SA into a plurality of sub-areas, and each of the sub-areas is provided with one micro lens 240A. With the arrangement of the extension portions 235, the tolerance of external force and the process margin of a fingerprint sensing module 200F may be further increased. In addition, the microlenses 240A may be prevented from receiving stray light incident at a large angle, such that the collimation effect may be improved, thereby improving the fingerprint recognition capability (that is, the resolution of fingerprint images) of the fingerprint sensing module 200F.

Figure 8:
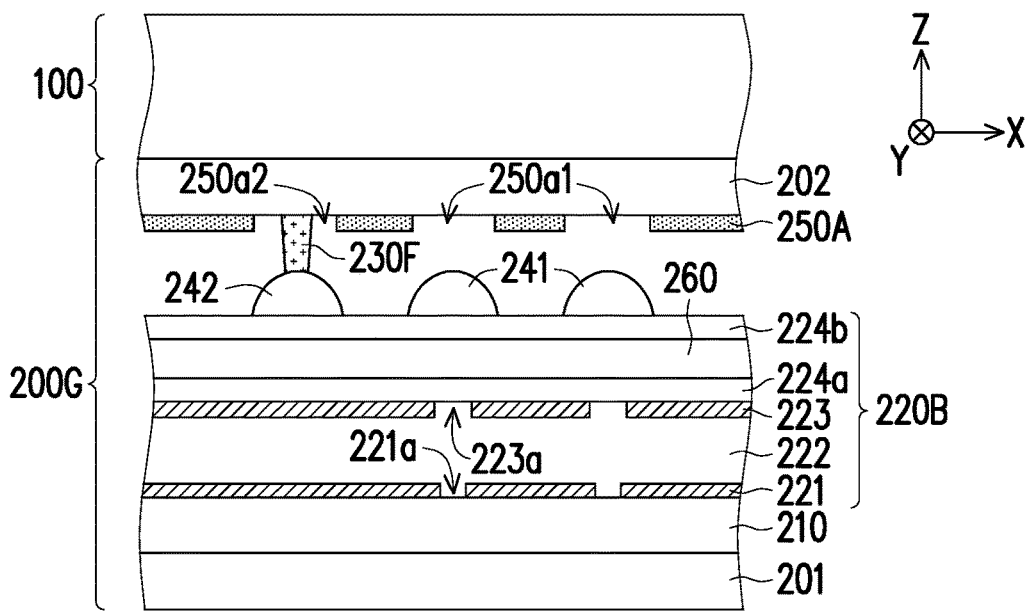
FIG. 8 is a schematic cross-sectional view of a display apparatus according to an eighth embodiment of the disclosure.
Figure 9:
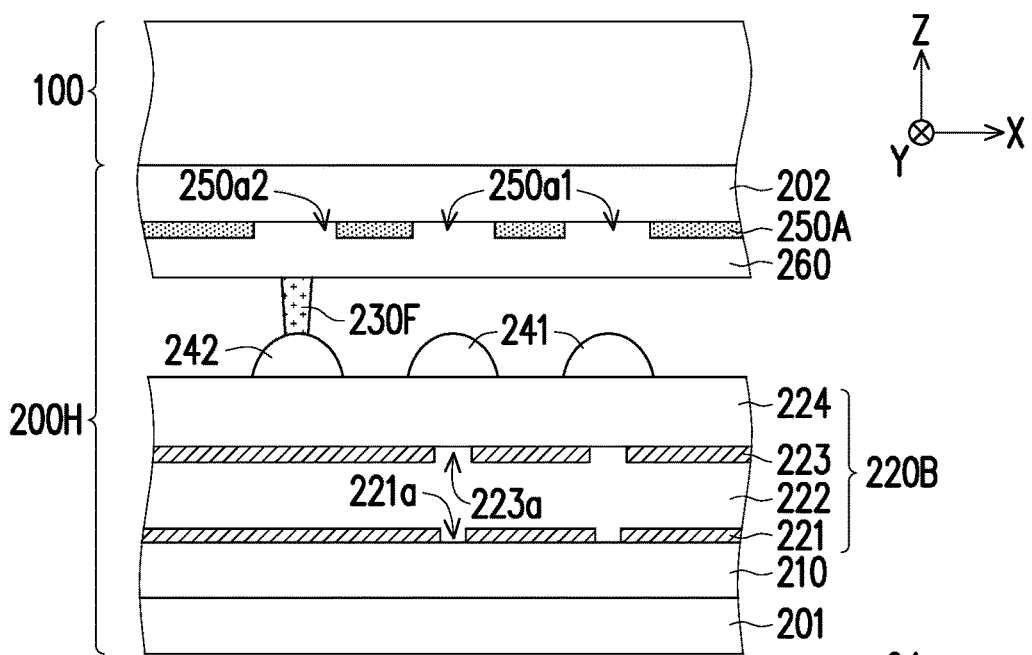
FIG. 9 is a schematic cross-sectional view of a display apparatus according to a ninth embodiment of the disclosure.

FIG. 8 is a schematic cross-sectional view of a display apparatus according to an eighth embodiment of the disclosure. FIG. 9 is a schematic cross-sectional view of a display apparatus according to a ninth embodiment of the disclosure. In FIG. 8, the main difference between a display apparatus 23 of this embodiment and the display apparatus 22 of FIG. 7B is that the arrangement of the spacer pattern and the arrangement of the filter layer. In this embodiment, a spacer pattern 230F of a fingerprint sensing module 200G of the display apparatus 23 is disposed on a second substrate 202.

Please particularly note that the fingerprint sensing module 200G may also optionally include another light-shielding pattern layer 250A disposed on the second substrate 202. The light-shielding pattern layer 250A has a plurality of openings 250a1 and a plurality of openings 250a2. In the light-receiving direction (for example, a direction Z) of the fingerprint sensing module 200G, the openings 250a1 overlap a plurality of first microlenses 241, and the openings 250a2 overlap a plurality of second microlenses 242, respectively. The spacer pattern 230F is located in the openings 250a2 and directly contacts the second substrate 202.

On the other hand, in this embodiment, the first microlens 241, the second microlens 242, and a filter layer 260 are all disposed on a first substrate 201. For example, a collimation structure layer 220B further has a flat sub-layer 224a and a flat sub-layer 224b sequentially that are stacked in sequence on a light-shielding pattern layer 223, and the filter layer 260 is disposed between the two flat sub-layers. It is worth mentioning that the arrangement of the flat sub-layer 224b may also increase the adhesion between the microlens (such as the first microlenses 241 and the second microlenses 242) and the collimation structure layer 220B. However, the present disclosure is not limited thereto. In other embodiments, a filter layer 260 of a fingerprint sensing module 200H of a display apparatus 24 may also be disposed on a second substrate 202 and located between a light-shielding pattern layer 250A and a spacer pattern 230F (as shown in FIG. 9).

Figure 10A:
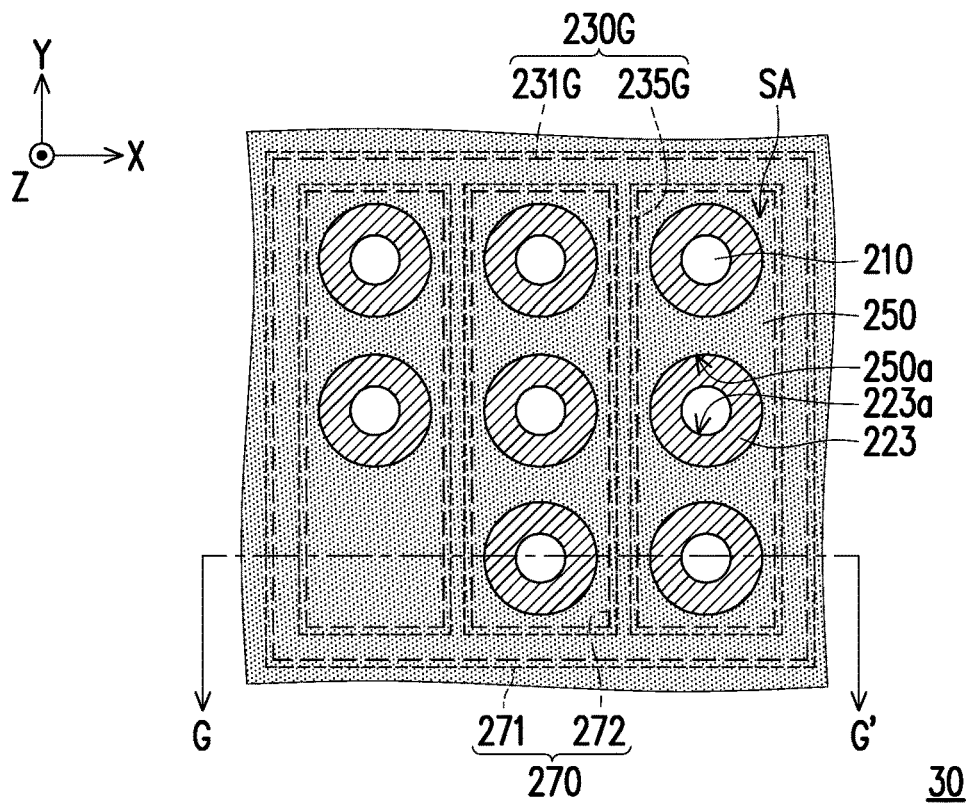
FIG. 10A is a schematic top view of a display apparatus according to a tenth embodiment of the disclosure.
Figure 10B:
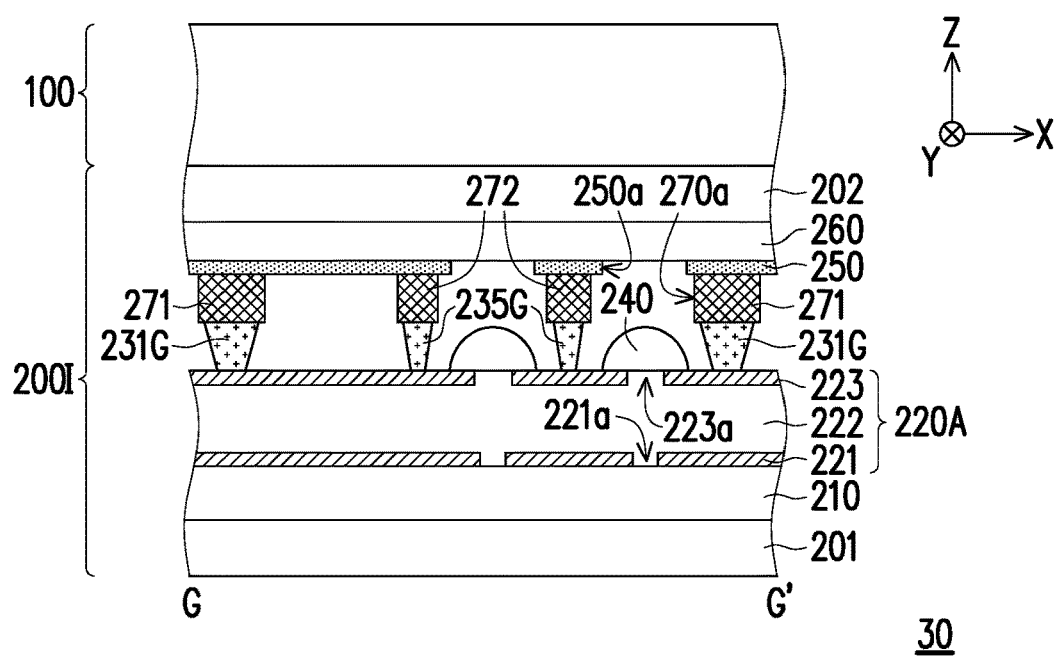
FIG. 10B is a schematic cross-sectional view of the display apparatus of FIG. 10A.

FIG. 10A is a schematic top view of a display apparatus according to a tenth embodiment of the disclosure. FIG. 10B is a schematic cross-sectional view of the display apparatus of FIG. 10A. FIG. 10B corresponds to a section line G-G' of FIG. 10A. For the sake of clarity, FIG. 10A only shows a photosensitive element layer 210, a light-shielding pattern layer 223 of a collimation structure layer 220A, a spacer pattern 230G, a light-shielding pattern layer 250, and a flat layer 270 of FIG. 10B.

In FIG. 10A and FIG. 10B, the difference between a display apparatus 30 of this embodiment and the display apparatus 10 of FIG. 1A lies in the composition and the arrangement of the fingerprint sensing module. Specifically speaking, the display apparatus 30 further includes the flat layer 270, and the flat layer 270 does not overlap a plurality of microlenses 240 in a direction Z.

In this embodiment, the spacer pattern 230G and the flat layer 270 are disposed on a second substrate 202 (or the light-shielding pattern layer 250), and the flat layer 270 is located between the spacer pattern 230G and the light-shielding pattern layer 250. For example, the spacer pattern 230G includes a plurality of extension portions 231G and a plurality of extension portions 235G, and the extension portions 231G may define a plurality of sensing pixel areas SA of a fingerprint sensing module 200I, and the extension portions 235G extend between any adjacent two of the microlenses 240 disposed in a direction X in each of the sensing pixel areas SA. In other words, in this embodiment, the extending direction of the extension portions 235G may be parallel to a direction Y, but it is not limited thereto. In other embodiments, the extending direction of the extension portions 235G may be parallel to the direction X to form the configuration of the extension portion 235 as in FIG. 2A.

It is worth mentioning that the arrangement of the flat layer 270 provides the arrangement surface of the spacer pattern 230G with better flatness. In order to prevent the sensing light from the light-receiving surface (such as the interface between the display panel 100 and the fingerprint sensing module 200D) of the fingerprint sensing module 200I from losing light energy when passing through the flat layer 270 and thereby increasing the light energy utilization rate of the fingerprint sensing module 200I for sensing light, the flat layer 270 of this embodiment may be patterned corresponding to the configuration of the spacer pattern 230G.

For example, the flat layer 270 may include a plurality of extension portions 271 and a plurality of extension portions 272. In the direction Z, the extension portions 271 respectively overlap the extension portions 231G of the spacer pattern 230G, and the extension portions 272 respectively overlap the extension portions 235G of the spacer pattern 230G. In other words, the extension portions 271 of the flat layer 270 may also be disposed around each of the microlens groups, and the extension portions 272 of the flat layer 270 may also extend between any adjacent two of the microlenses 240 disposed in each of the sensing pixel areas SA in the direction X. On the other hand, in this embodiment, a filter layer 260 of the fingerprint sensing module 200I is disposed on the second substrate 202 and is located between the light-shielding pattern layer 250 and the second substrate 202. However, the present disclosure is not limited thereto. In other embodiment, the display apparatus may not have the filter layer 260.

Figure 11:
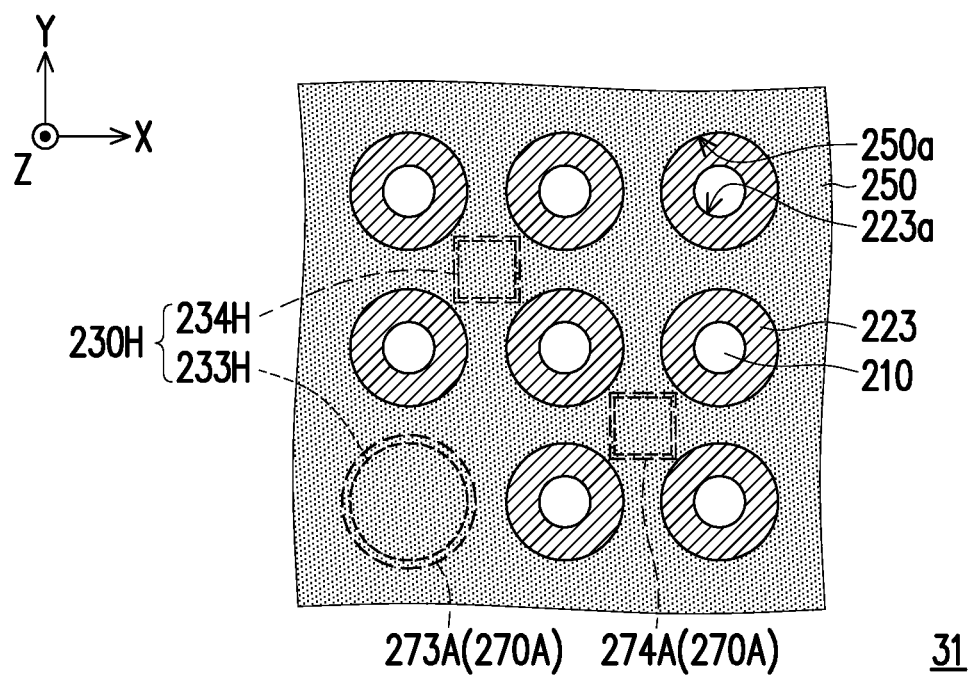
FIG. 11 is a schematic top view of a display apparatus according to the tenth embodiment of the present disclosure.

FIG. 11 is a schematic top view of a display apparatus according to the tenth embodiment of the present disclosure. In FIG. 11, the difference between a display apparatus 31 of this embodiment and the display apparatus 30 of FIG. 10A lies in the arrangement of the spacer pattern. Specifically speaking, a spacer pattern 230H of the display apparatus 31 has a plurality of columnar portions 233H and a plurality of columnar portions 234H, and the columnar portions 2334H and the columnar portions 234H are respectively disposed between a plurality of microlenses 240 of a plurality of microlens groups. In this embodiment, the contours of the two vertical projection of the columnar portion 233H and the columnar portion 234H on a light-shielding pattern layer 250 may be different from each other. For example, the contour of the vertical projection of the columnar portion 233H on the light-shielding pattern layer 250 is a circle, and the contour of the vertical projection of the columnar portion 234H on the light-shielding pattern layer 250 is a square, but it is not limited thereto. In other embodiments, the contour of the vertical projection and the projection area of the columnar portion of the spacer pattern on the light-shielding pattern layer 250 may be adjusted based on different product designs (for example, the arrangement and the spacing of the microlenses).

On the other hand, in this embodiment, a flat layer 270A has a plurality of columnar portions 273A corresponding to the columnar portions 233H of the spacer pattern 230H and a plurality of columnar portions 274A corresponding to the columnar portions 234H of the spacer pattern 230H, and the columnar portions 273A and the columnar portions 274A of the flat layer 270A do not overlap a plurality of openings 250a (or multiple microlenses) of the light-shielding pattern layer 250 in the light-receiving direction (for example, a direction Z) of the fingerprint sensing module. Accordingly, the loss of light energy of the sensing light from the light-receiving surface (such as the interface between the display panel 100 and the fingerprint sensing module 200I in FIG. 10B) of the fingerprint sensing module when passing through the flat layer 270A may be prevented, thereby increasing the light energy utilization rate of the fingerprint sensing module for sensing light.

Figure 12A:
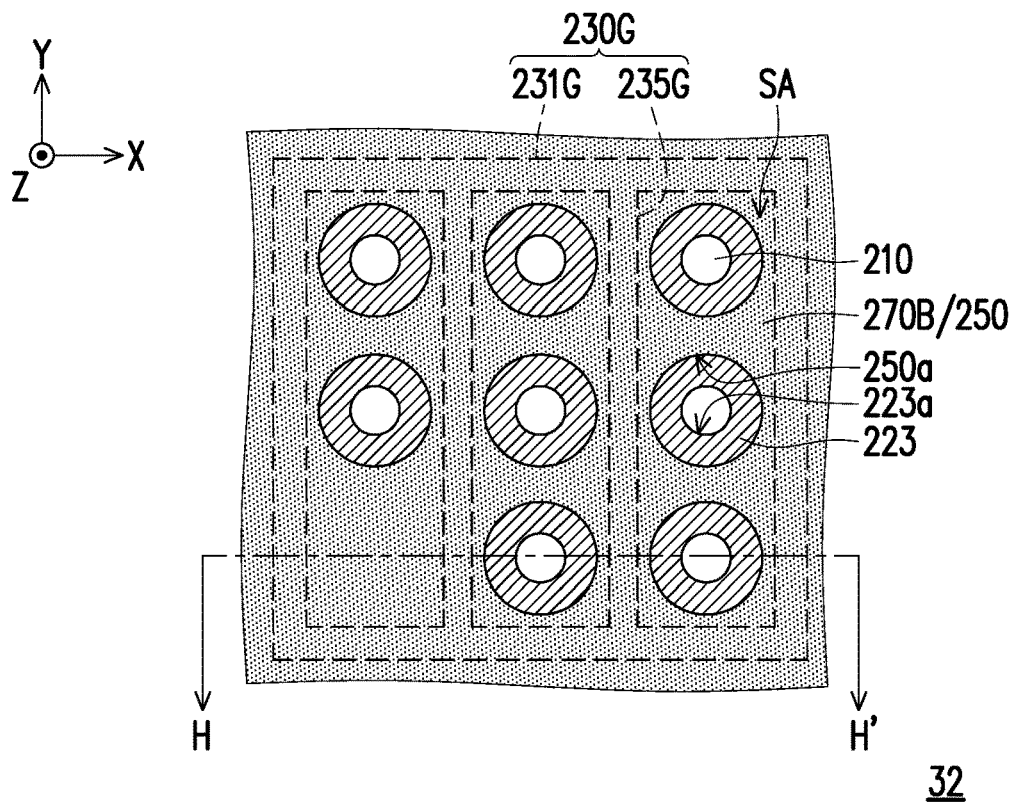
FIG. 12A is a schematic top view of a display apparatus according to an eleventh embodiment of the disclosure.
Figure 12B:
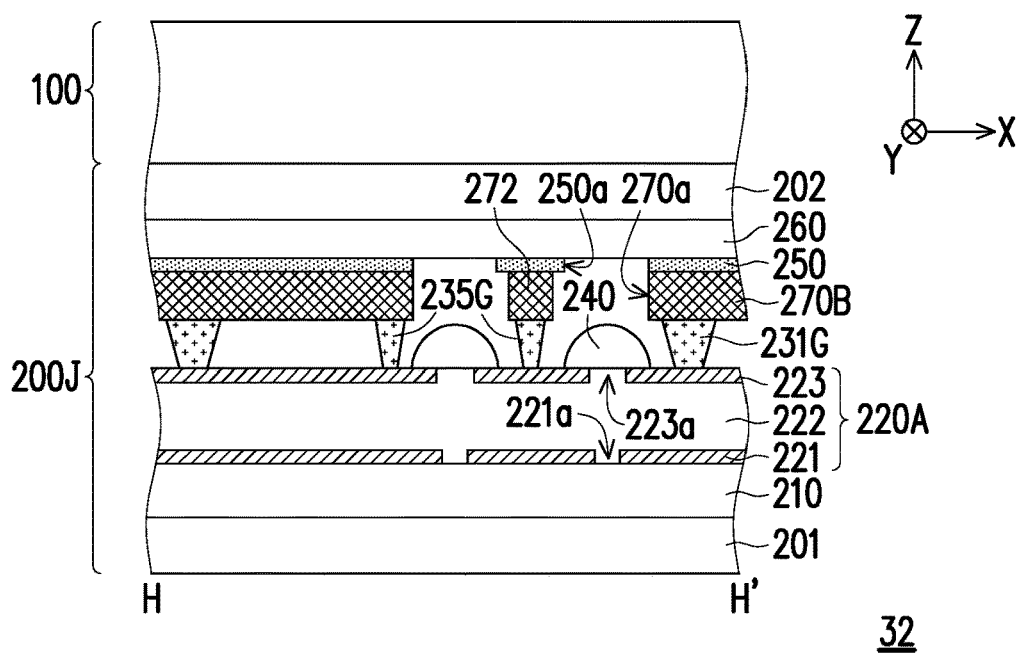
FIG. 12B is a schematic cross-sectional view of the display apparatus of FIG. 12A.

FIG. 12A is a schematic top view of a display apparatus according to an eleventh embodiment of the disclosure. FIG. 12B is a schematic cross-sectional view of the display apparatus of FIG. 12A. FIG. 12B corresponds to a section line H-H' of FIG. 12A. For the sake of clarity, FIG. 12A only shows a photosensitive element layer 210, a light-shielding pattern layer 223 of a collimation structure layer 220A, a spacer pattern 230G, a light-shielding pattern layer 250, and a flat layer 270B of FIG. 12B.

In FIG. 12A and FIG. 12B, the difference between a display apparatus 32 of this embodiment and the display apparatus 30 of FIG. 10A lies in the arrangement of the flat layer. Specifically speaking, the flat layer 270B of a fingerprint sensing module 200J of the display apparatus 32 completely covers the light-shielding pattern layer 250 in a direction Z, and has a plurality of openings 270a overlapping a plurality of openings 250a. For example, in this embodiment, the openings 270a of the flat layer 270B may be selectively aligned with the openings 250a of the light-shielding pattern layer 250 in the direction Z, but it is not limited thereto. In other words, the patterning of the flat layer 270B and the light-shielding pattern layer 250 may be performed by sharing the same mask, which helps reduce the production cost.

Figure 13A:
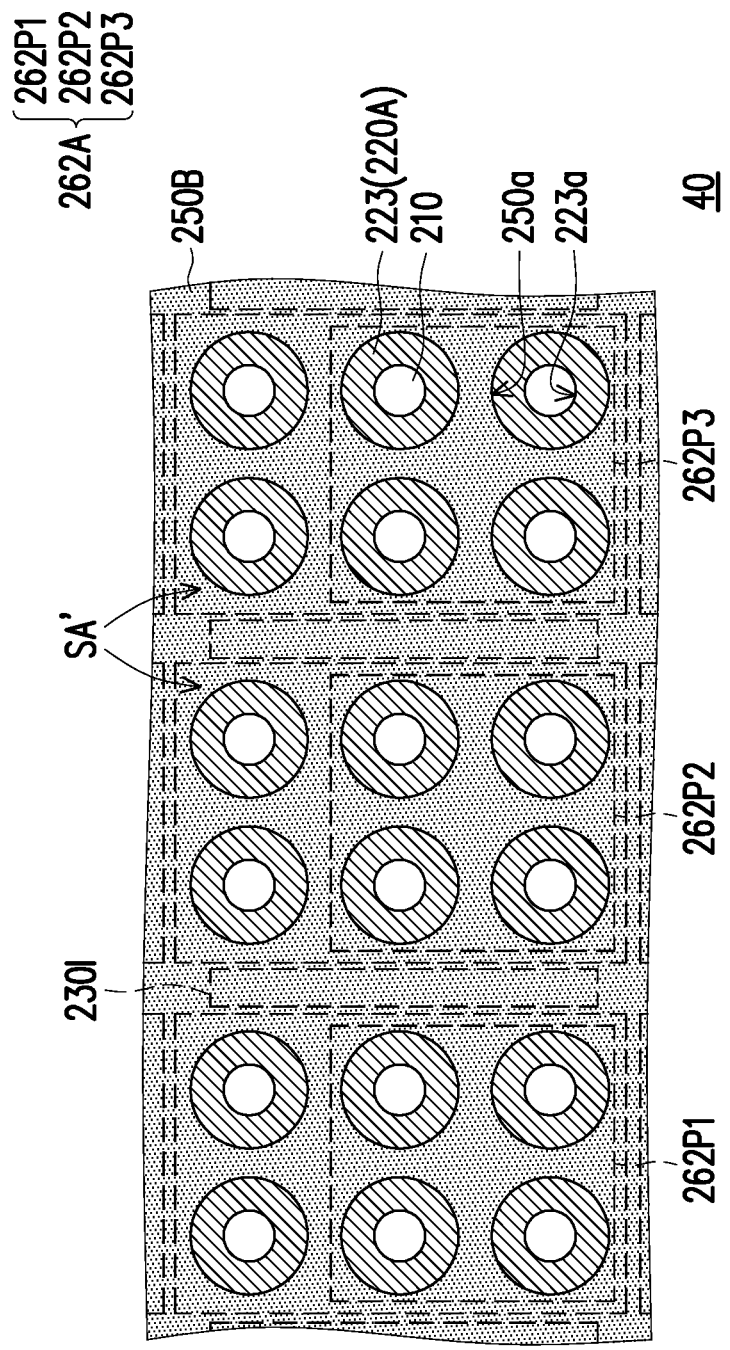
FIG. 13A is a schematic top view of a display apparatus according to a twelfth embodiment of the disclosure.
Figure 13B:
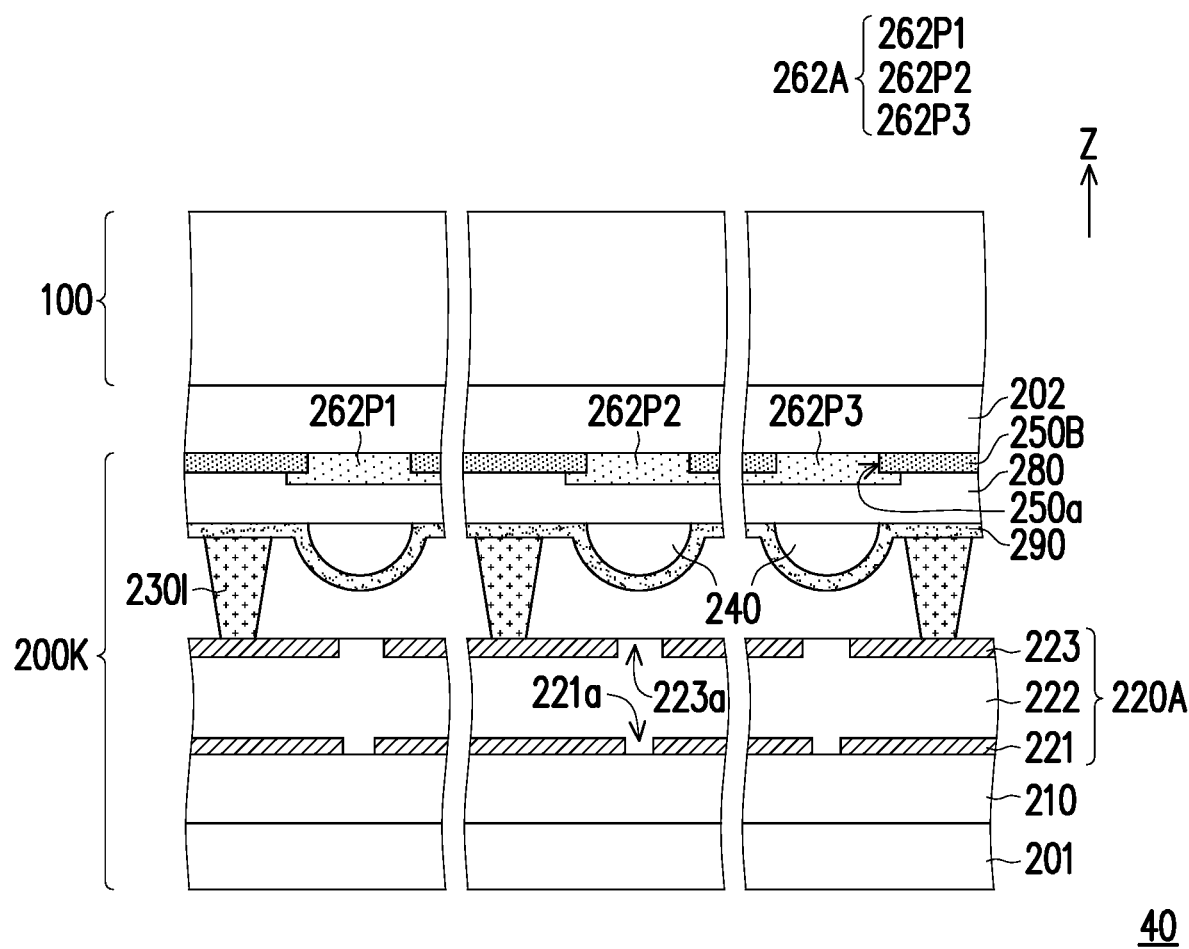
FIG. 13B is a schematic cross-sectional view of the display apparatus of FIG. 13A.

FIG. 13A is a schematic top view of a display apparatus according to a twelfth embodiment of the disclosure. FIG. 13B is a schematic cross-sectional view of the display apparatus of FIG. 13A. For the sake of clarity, FIG. 13A only shows a photosensitive element layer 210, a light-shielding pattern layer 223 of a collimation structure layer 220A, a spacer pattern 230I, a light-shielding pattern layer 250B, and a color filter layer 262A of FIG. 13B.

In FIG. 13A and FIG. 13B, the main difference between a display apparatus 40 of this embodiment and the display apparatus 10 of FIG. 1A is: in this embodiment, an auxiliary layer 290 is further provided between a plurality of microlenses 240 and a spacer pattern 230I of the display apparatus 40. More specifically, the auxiliary layer 290 covers the microlenses 240, and the spacer pattern 230I is disposed on the auxiliary layer 290. And the material of the auxiliary layer 290 may include metal oxide (for example, indium tin oxide or indium zinc oxide) and silicon nitride (SiNx).

With the arrangement of the auxiliary layer 290, the microlenses 240 may be prevented from being degraded due to the subsequent process of the spacer pattern 230I, which helps ensure the image sensing quality of a fingerprint sensing module 200K. Please particularly note that in this embodiment, the spacer pattern 230I and a plurality of sensing pixel areas SA' are alternately disposed only in a direction X. In other words, the spacer pattern 230I does not surround each of the sensing pixel areas SA' as the spacer pattern 230 do in FIG. 1A.

In this embodiment, the spacer pattern 230I is provided between two adjacent sensing pixel areas SA' in the direction X, but it is not limited thereto. In other embodiments, it is also possible to configure one spacer pattern for every three sensing pixel areas SA'. Accordingly, the spacing distance between the auxiliary layer 290 (or the microlens 240) and the collimation structure layer 220A of the fingerprint sensing module 200K is stabilized, so as to improve the stability of the fingerprint recognition signal.

On the other hand, in this embodiment, the spacer pattern 230I and the microlenses 240 are both disposed on a second substrate 202, and a light-shielding pattern layer 250B is located between the second substrate 202 and the microlenses 240 (or the spacer pattern 230I). Please particularly note that a filter layer is provided at a plurality of openings 250a of the light-shielding pattern layer 250B of this embodiment. For example, the filter layer is, for example, a color filter layer 262A, which includes a color filter pattern 262P1, a color filter pattern 262P2, and a color filter pattern 262P3. These color filter patterns respectively overlap the light-shielding pattern layer 250B in a direction Z and are located in the openings 250a in the sensing pixel areas SA', and are suitable for different colors of light (such as red light, green light, and blue light) to pass. In order to improve the flatness of the arrangement surface of the microlens 240, a flat layer 280 may be further provided between the microlens 240 and the light-shielding pattern layer 250B (or the color filter layer 262A) of this embodiment.

In this embodiment, the number of the microlenses 240 included in each of the sensing pixel areas SA' and the number of the openings 250a (or the microlenses 240) overlapped by each color filter pattern are exemplified to be six and four, respectively, and it does not mean that the present disclosure is limited to the content disclosed in the drawings. In other embodiments, the number of these elements may be adjusted based on applications and specifications of the actual product. Since the collimation structure layer 220A of this embodiment is similar to that in the display apparatus 21 of FIG. 6A, please refer to the relevant paragraphs of the foregoing embodiment for detailed descriptions, as they are not repeated herein.

Figure 14:
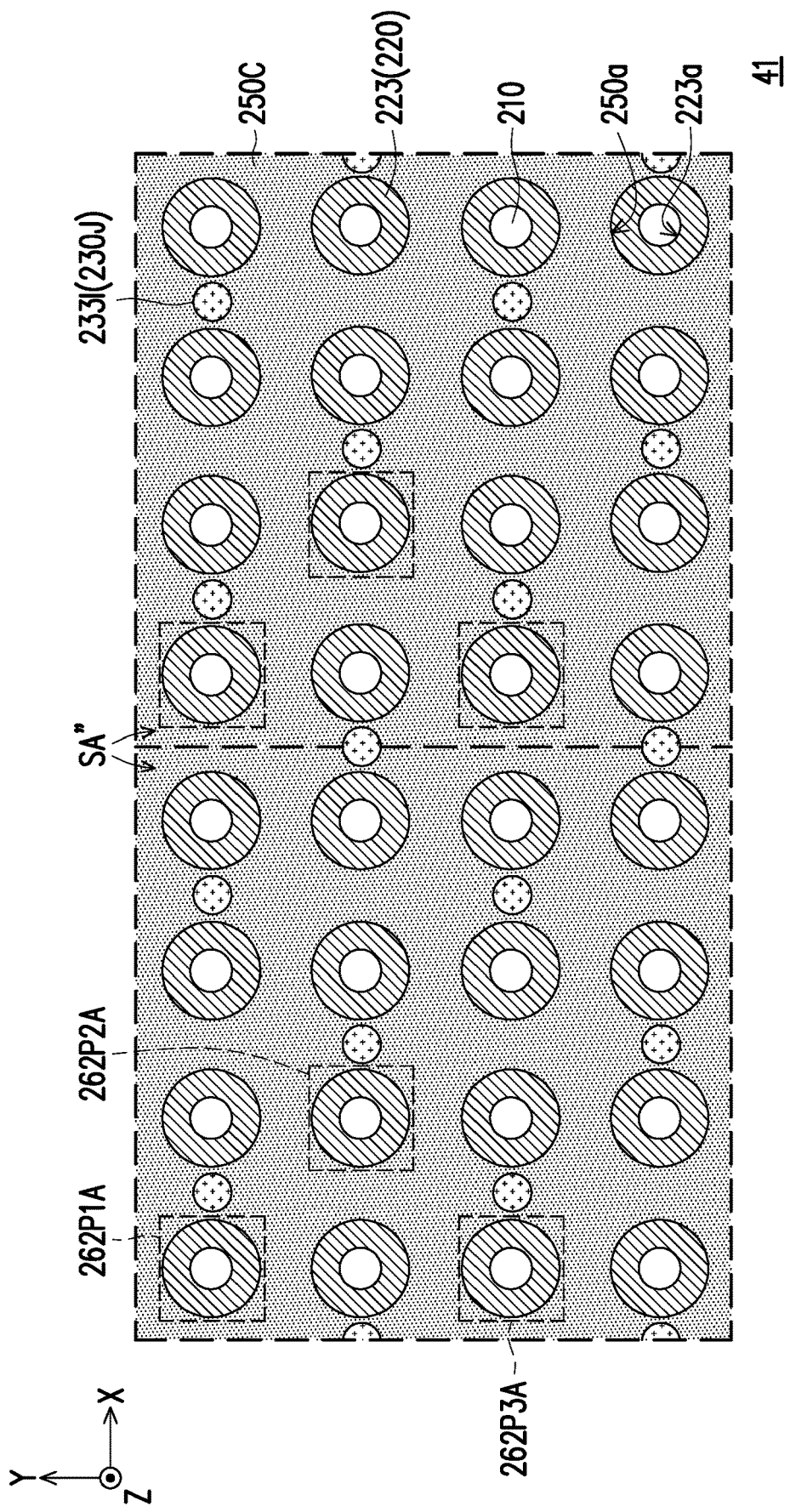
FIG. 14 is a schematic top view of a display apparatus according to a thirteenth embodiment of the disclosure.

FIG. 14 is a schematic top view of a display apparatus according to a thirteenth embodiment of the disclosure. In FIG. 14, the main difference between a display apparatus 41 of this embodiment and the display apparatus 10 of FIG. 1A lies in the configuration and the arrangement of the spacer pattern. In this embodiment, a spacer pattern 230J may have a plurality of columnar portions 233I, and the columnar portions 233I are dispersedly disposed in each of the sensing pixel areas SA". In order to improve the assembly yield of the display apparatus 41, the percentage of the vertical projection area of the columnar portions 233I in the same sensing pixel area SA" on the photosensitive element layer 210 and the vertical projection area of each of the sensing pixel areas SA" on the photosensitive element layer 210 may fall between 1% and 5%.

And, unlike the display apparatus 40 of FIG. 13A, the number of opening 250a (or the microlens) of a light-shielding pattern layer 250C overlapped by each color filter pattern (for example, a color filter pattern 262P1A, a color filter pattern 262P2A, and a color filter pattern 262P3A) in this embodiment is one, and each of the sensing pixel areas SA" is provided with the color filter pattern 262P1A, the color filter pattern 262P2A, and the color filter pattern 262P3A that allow three different colors of light (such as red light, green light, and blue light) to pass through to achieve the anti-counterfeiting effect of fingerprint recognition.

Figure 15:
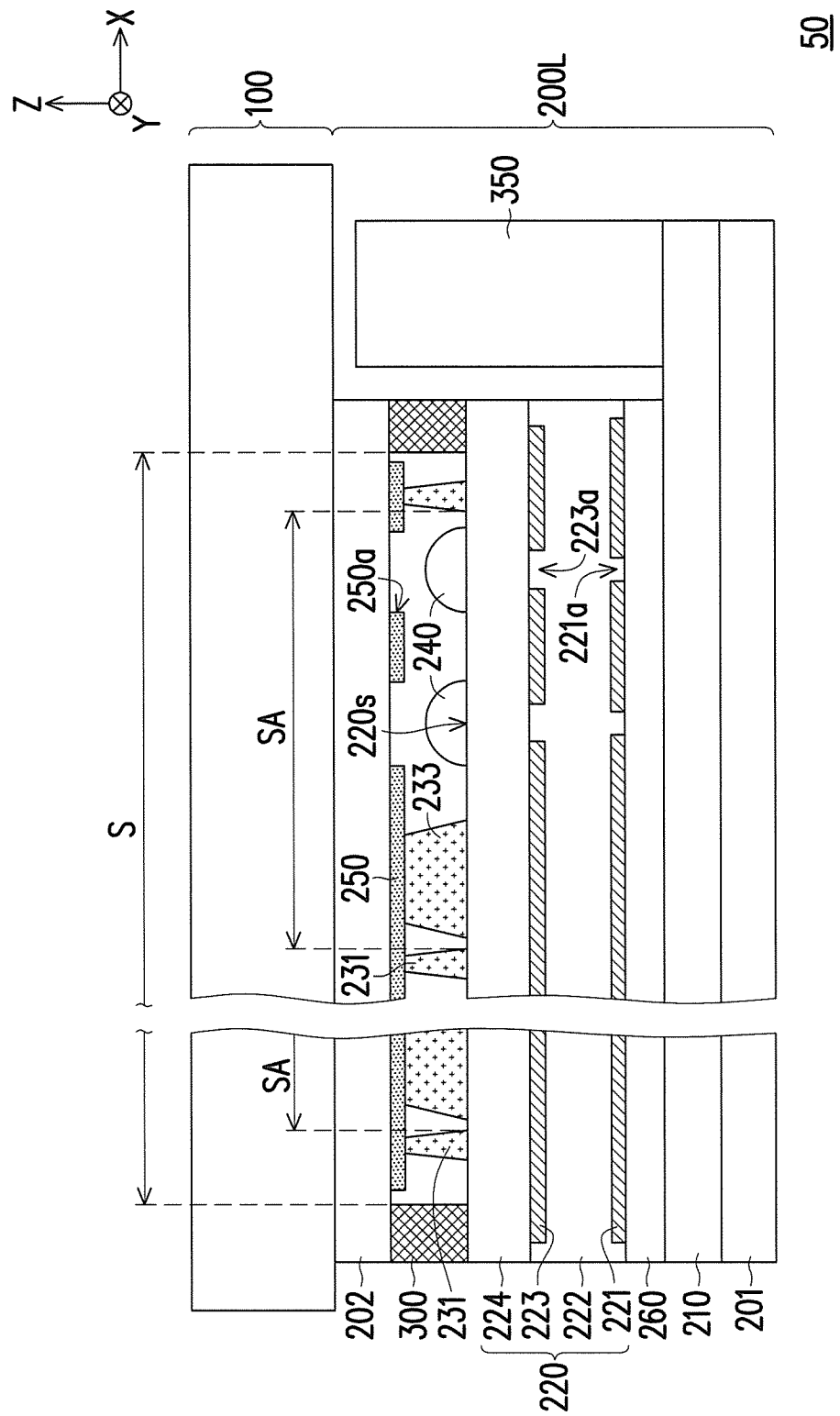
FIG. 15 is a schematic cross-sectional view of a display apparatus according to a fourteenth embodiment of the present disclosure.
Figure 16:
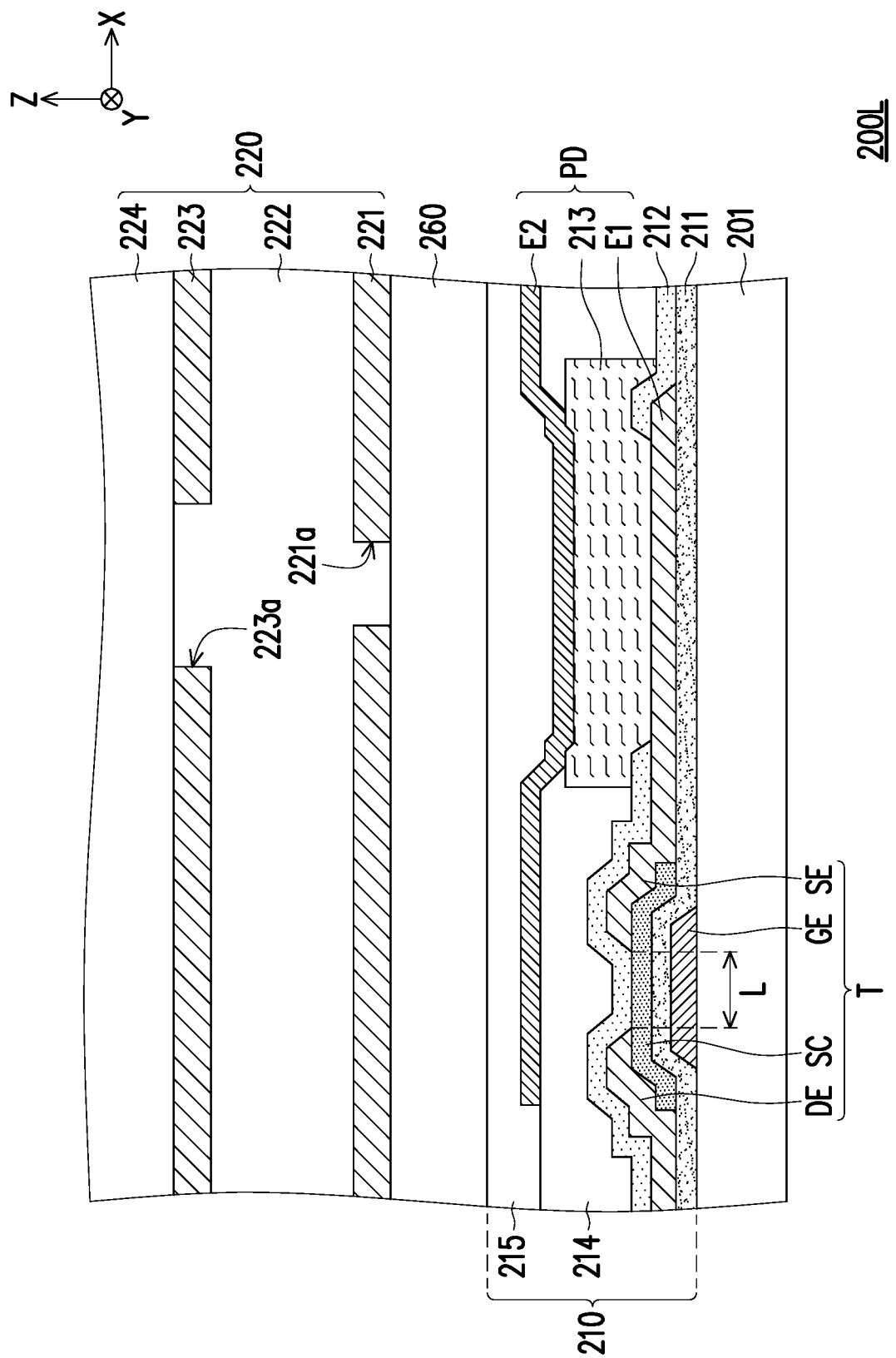
FIG. 16 is a partially enlarged view of the fingerprint sensing module of FIG. 15.

FIG. 15 is a schematic cross-sectional view of a display apparatus according to a fourteenth embodiment of the present disclosure. FIG. 16 is a partially enlarged view of the fingerprint sensing module of FIG. 15. In FIG. 15, in this embodiment, a display apparatus 50 may implement the under-display fingerprint sensing of a full-screen display panel. Therefore, the size of a fingerprint sensing module 200L of this embodiment can be slightly smaller than the size of a display panel 100. In this embodiment, the fingerprint sensing module 200L further includes a sealant layer 300 surrounding a plurality of sensing pixel areas SA. The sealant layer 300 is disposed between a collimation structure layer 220 and a second substrate 202.

From another point of view, the sealant layer 300, the collimation structure layer 220, and the second substrate 202 define an accommodating space, and a spacer pattern 230 and a plurality of microlenses 240 are disposed in the accommodating space. The configuration of the sealant layer 300 prevents the intrusion of external moisture and foreign objects, which helps improve the reliability of the fingerprint sensing module 200L.

In this embodiment, the display apparatus 50 is, for example, a smart watch, a smart phone, or a tablet computer having a fingerprint recognition function, but the disclosure is not limited thereto. In some embodiments, since the size of the fingerprint sensing module 200L is equivalent to the size of the display screen of the display panel 100, the user may perform fingerprint recognition in any area of the display screen to unlock and operate the display apparatus 50 with convenience.

Please also refer to FIG. 16. In this embodiment, a photosensitive element layer 210 includes a plurality of active devices T and a plurality of sensing elements PD. The sensing elements PD are respectively disposed corresponding to a plurality of openings 250a of a light-shielding pattern layer 250, and are electrically connected to the active devices T. For example, the method of forming the active device T includes the following steps: sequentially forming a gate electrode GE, a gate insulating layer 211, a semiconductor pattern SC, a source electrode SE, and a drain electrode DE on the first substrate 201, where the source electrode SE and the drain electrode DE directly contact two different areas of the semiconductor pattern SC (for example, a source region SR and a drain region DR). In this embodiment, a length L of the semiconductor pattern SC along a direction X that is located at a channel region CH between the source region SR and the drain region DR is greater than or equal to 1 μm. The proper length L of the channel region forms a fingerprint sensing module in a proper size, which is more suitable for fingerprint recognition.

In this embodiment, the gate electrode GE of the active device T may be selectively disposed under the semiconductor pattern SC to form a bottom-gate TFT (thin-film transistor), but the disclosure is not limited to this. According to other embodiments, the gate electrode GE of the active device is also disposed above the semiconductor pattern SC to form a top-gate TFT. The material of the semiconductor pattern SC is, for example, an amorphous silicon material. In other words, the active device T may be an amorphous silicon TFT (a-Si TFT). However, the present disclosure is not limited to this. In other embodiments, the active device may also be a low-temperature polysilicon thin-film transistor (LIPS TFT), a micro-Si TFT, or a metal oxide transistor.

On the other hand, the sensing element PD includes a first electrode E1, a second electrode E2, and a photoelectric conversion pattern 213. The first electrode E1 and the second electrode E2 are respectively disposed on opposite sides of the photoelectric conversion pattern 213. For example, in this embodiment, the first electrode E1 of the sensing element PD may selectively be disposed in the same film layer with the source electrode SE and drain electrode DE of the active device T, but it is not limited to this. The photosensitive element layer 210 further includes the insulating layer 212, a flat layer 214, and a flat layer 215. The insulating layer 212 covers the active device T, and the photoelectric conversion pattern 213 of the sensing element PD penetrates the insulating layer 212 to be electrically connected to the first electrode E1. The flat layer 214 covers the active device T and the photoelectric conversion pattern 213. The second electrode E2 of the sensing element PD is disposed between the flat layer 214 and the flat layer 215, and penetrates the flat layer 214 to be electrically connected to the photoelectric conversion pattern 213.

In summary, in the fingerprint sensing module of an embodiment of the present disclosure, by disposing the microlenses and the spacer pattern between the first substrate and the second substrate, the tolerance of external force and/or the process margin of the fingerprint sensing module may be increased, thereby improving the process yield and the reliability of the fingerprint sensing module. And, the flat layer for carrying the spacer pattern having openings that overlap the microlenses may increase the light energy utilization rate of the fingerprint sensing module for sensing light, thereby improving the overall sensing sensitivity.

What is claimed is:

1. A fingerprint sensing module having a plurality of sensing pixel areas, and comprising:
   a first substrate;
   an active device, disposed on the first substrate;
   a photosensitive element layer, disposed on the first substrate, and electrically connected to the active device;
   a collimation structure layer, disposed on the photosensitive element layer;
   a second substrate, disposed on the collimation structure layer;
   a plurality of microlenses, disposed on a side surface of the collimation structure layer facing away from the photosensitive element layer, and overlapping the photosensitive element layer, wherein the microlenses are divided into a plurality of microlens groups, and the microlens groups are respectively located in the sensing pixel areas;
   a spacer pattern, extending between the microlens groups; and
   a sealant layer, surrounding the sensing pixel areas, wherein the sealant layer, the microlenses and the spacer pattern are located between the collimation structure layer and the second substrate, and the collimation structure layer is spaced apart from the second substrate by the spacer pattern.

2. The fingerprint sensing module according to claim 1, wherein the spacer pattern surrounds each of the microlens groups.

3. The fingerprint sensing module according to claim 1, wherein the spacer pattern extends between any adjacent two of the microlenses.

4. The fingerprint sensing module according to claim 3, wherein the spacer pattern comprises:
a plurality of columnar portions, disposed respectively in the sensing pixel areas; and
a plurality of extension portions, extending between the microlenses and the columnar portions.

5. The fingerprint sensing module according to claim 1, further comprising a light-shielding pattern layer disposed on the second substrate and comprising a plurality of openings, wherein the openings respectively overlap the microlenses.

6. The fingerprint sensing module according to claim 1, further comprising a filter layer disposed between the photosensitive element layer and the collimation structure layer.

7. The fingerprint sensing module according to claim 1, further comprising:
a light-shielding pattern layer, disposed on the second substrate, wherein the spacer pattern is disposed on the second substrate.

8. The fingerprint sensing module according to claim 7, further comprising a color filter layer, located between the photosensitive element layer and the light-shielding pattern layer.

9. The fingerprint sensing module according to claim 1, further comprising:
an auxiliary layer, covering the microlenses and located between the microlenses and the spacer pattern.

10. A fingerprint sensing module, comprising:
a first substrate;
a photosensitive element layer, disposed on the first substrate;
a collimation structure layer, disposed on the photosensitive element layer;
a second substrate, disposed on the collimation structure layer;
a plurality of microlenses, disposed between the collimation structure layer and the second substrate, and overlapping the photosensitive element layer;
a spacer pattern, overlapping part of the microlenses; and
a sealant layer, surrounding the sensing pixel areas, wherein the sealant layer, the microlenses and the spacer pattern are located between the collimation structure layer and the second substrate, and the collimation structure layer is spaced apart from the second substrate by the spacer pattern.

11. The fingerprint sensing module according to claim 10, further comprising a plurality of sensing pixel areas, wherein the microlenses are divided into a plurality of microlens groups, the microlens groups are respectively located in the sensing pixel areas, and the spacer pattern surrounds each of the microlens groups.

12. The fingerprint sensing module according to claim 10, further comprising a filter layer disposed on the second substrate and located between the microlenses and the second substrate.

13. The fingerprint sensing module according to claim 10, wherein the microlenses are disposed on the second substrate, and the spacer pattern is disposed on a side surface of the collimation structure layer facing away from the photosensitive element layer.

14. The fingerprint sensing module according to claim 10, further comprising:
a light-shielding pattern layer disposed on the second substrate and comprising a plurality of openings, wherein the microlenses are disposed on a side surface of the collimation structure layer facing away from the photosensitive element layer, and the spacer pattern is disposed on the second substrate and is located in part of the openings of the light-shielding pattern layer.

15. The fingerprint sensing module according to claim 10, further comprising:
a light-shielding pattern layer disposed on the second substrate and comprising a plurality of openings, wherein the microlenses are disposed on a side surface of the collimation structure layer facing away from the photosensitive element layer, and overlap respectively part of the openings of the light-shielding pattern layer.

16. A fingerprint sensing module, comprising:
a first substrate;
a photosensitive element layer, disposed on the first substrate;
a collimation structure layer, disposed on the photosensitive element layer;
a second substrate, disposed on the collimation structure layer;
a plurality of microlenses, disposed between the collimation structure layer and the second substrate, and overlapping the photosensitive element layer;
a light-shielding pattern layer, comprising a plurality of first openings, and the first openings respectively overlapping the microlenses;
a flat layer, not overlapping the microlenses; and
a spacer pattern, adapted to overlap the flat layer, wherein the flat layer is located between the spacer pattern and the light-shielding pattern layer.

17. The fingerprint sensing module according to claim 16, wherein the light-shielding pattern layer, the flat layer, and the spacer pattern are disposed on the second substrate.

18. The fingerprint sensing module according to claim 16, further comprising a plurality of sensing pixel areas, wherein the microlenses are divided into a plurality of microlens groups, the microlens groups are respectively located in the sensing pixel areas, and the flat layer and the spacer pattern surround each of the microlens groups.

19. The fingerprint sensing module according to claim 18, wherein the flat layer and the spacer pattern further extend between any adjacent two of the microlenses disposed in at least one direction.

20. The fingerprint sensing module according to claim 16, wherein the flat layer completely covers the light-shielding pattern layer and comprises a plurality of second openings overlapping the first openings.

* * * * *